United States Patent [19]

Inoue

[11] Patent Number: 5,689,470
[45] Date of Patent: Nov. 18, 1997

[54] SEMICONDUCTOR MEMORY DEVICE AND METHOD FOR ACCESSING A MEMORY IN THE SAME

[75] Inventor: Kouji Inoue, Ikoma, Japan

[73] Assignee: Sharp Kabushiki Kaisha, Osaka, Japan

[21] Appl. No.: 757,761

[22] Filed: Nov. 27, 1996

[30] Foreign Application Priority Data

Nov. 29, 1995 [JP] Japan ................................. 7-311439

[51] Int. Cl.$^6$ ................................................. G11C 7/00
[52] U.S. Cl. ................. 365/203; 365/230.03; 365/238.5
[58] Field of Search ............................. 365/203, 230.03, 365/238.5, 189.04

[56] References Cited

U.S. PATENT DOCUMENTS

| | | | |
|---|---|---|---|
| 5,295,099 | 3/1994 | Kagami | 365/238.5 X |
| 5,430,672 | 7/1995 | Kuwabara et al. | 365/203 X |
| 5,453,955 | 9/1995 | Sakui et al. | 365/203 |
| 5,592,426 | 1/1997 | Jallice et al. | 365/203 |

FOREIGN PATENT DOCUMENTS

| | | |
|---|---|---|
| 61-217992 | 9/1986 | Japan. |
| 1-199398 | 8/1989 | Japan. |
| 2-12694 | 1/1990 | Japan. |

Primary Examiner—Son T. Dinh
Attorney, Agent, or Firm—Morrison & Foerster LLP

[57] ABSTRACT

A semiconductor memory device includes a plurality of memory cells arranged in a matrix, each of which has a gate electrode, a first electrode and a second electrode. The semiconductor memory device includes a plurality of word lines, at least one of which is connected to the gate electrode of one of the plurality of memory cells; a plurality of bit lines, at least one of which is connected to the first electrode of one of the plurality of memory cells and a plurality of virtual ground lines, at least one of which is connected to the second electrode of one of the plurality of memory cells. The semiconductor memory device also includes a determination circuit for generating a determination signal based on an address signal, and a precharge and access circuit for applying one of a first voltage and a second voltage to at least one of the plurality of bit lines and applying one of a third voltage and a fourth voltage to at least one of the plurality of virtual ground lines, wherein the voltage applications are based on the determination signal.

11 Claims, 13 Drawing Sheets

SEMICONDUCTOR MEMORY DEVICE AND METHOD FOR ACCESSING A MEMORY IN THE SAME

BACKGROUND OF THE INVENTION

1. Field of the Invention

The present invention relates to a semiconductor memory device and a method for accessing a memory in the semiconductor memory device. In particular, the present invention relates to a semiconductor memory device operable in a page mode and a method for accessing such a semiconductor memory device in the page mode.

2. Description of the Related Art

Some conventional semiconductor memory devices have a page mode or a burst mode function which allows the continuous reading of data at high speed. Among such semiconductor memory devices, a mask ROM reads data in the following manner. In a page mode or the like, the next access address of the memory cell is known in advance, and therefore a plurality of (e.g., four to eight) memory cells to be read next are accessed using a conventional precharge circuit. The data read from these memory cells are amplified by a plurality of (e.g., four to eight) sensing amplifiers and then stored in a plurality of registers.

In such a system, high-speed continuous reading of data requires a plurality of sensing amplifiers and a plurality of registers for storing data.

FIG. 12 is a block diagram of a conventional semiconductor memory device 201 having a page mode function. The page mode is a mode in which data stored in an area from a first address to a second address are read continuously. The semiconductor memory device 201 includes a memory cell array 10 divided into four memory blocks 10a and a precharge circuit 211 for precharging bit lines and virtual GND (ground) lines. The precharge circuit 211 is structured so that the number of bit lines which can be precharged simultaneously may be adjusted.

The semiconductor memory device 201 includes a plurality of sensing amplifiers 212 for amplifying data read from the memory cell array 10. The number of the sensing amplifiers 212 corresponds to the number of bit lines which can be simultaneously precharged by the precharge circuit 211. The semiconductor memory device 201 further includes a plurality of data registers 213 respectively for storing the data amplified by the sensing amplifiers 212.

The semiconductor memory device 201 operates in the following manner.

When a word line becomes active, the bit lines corresponding to a plurality of memory cells (four memory cells in the example shown in FIG. 12) which are connected to the word line are accessed. Then, data read from the memory cell array 10 is amplified by the sensing amplifiers 212 and stored in the data registers 213.

The data stored in the data registers 213 is read from a pad 215 through an output buffer 214. When the data is read, the bit lines corresponding to the four memory cells connected to the word line are accessed.

In an attempt to achieve a shorter access time and still maintain continuous operation, the above-described operation method is used together with an operation method of precharging all the bit lines in advance (see Japanese Laid-Open Patent Publication No. 61-217992). Accordingly, the precharge time for the bit lines after the access to the bit lines starts is shortened, and thus the access time is decreased.

Alternatively, the access time can be decreased by precharging a greater number of memory cells simultaneously and thus increasing the number of bit lines for which the levels are to be established, instead of increasing the number of sensing amplifiers.

In such a case, the size or number of the precharge circuits are increased. In order to further increase the reading speed, the number of memory cells to be accessed in advance needs to be further increased, which requires a further rise in the size or number of the precharge circuits. As a result, the chip is enlarged.

FIG. 13 is a block diagram of a conventional semiconductor memory device 202 having a greater number of precharge circuits in order to realize a faster speed access time.

The semiconductor memory device 202 includes first and second precharge circuits 211a and 211b, a single sensing amplifier 212 and a single data register 213. In such a circuit configuration, data in odd-numbered memory blocks 10a and data in even-numbered memory blocks 10b are read alternately.

The semiconductor memory device 202 operates in the following manner.

A plurality of desired bit lines in an odd-numbered memory block 10a are accessed by the first precharge circuit 211a. When the potential of these bit lines moves to the GND potential, the data read through the bit lines are amplified by the sensing amplifier 212 and stored in the data register 213. Thus, the data is output sequentially. While the data is output in this manner, a plurality of desired bit lines in an even-numbered memory block 10b are accessed by the second precharge circuit 211b. In this manner, while the data from the odd-numbered memory block 10a is output, the bit lines in the even-numbered memory block 10b are precharged; and while the data from the even-numbered memory block 10b is output, the bit lines in the odd-numbered memory block 10a is precharged. Thus, data can be read at a higher speed.

In the case where it is known in advance that the addresses of the memory cells to be accessed are sequentially incremented, for example, in the case of a serial access mode such as a page mode or a burst mode, while the data output by the first precharge circuit 211a is amplified by the sensing amplifier 212, the bit lines corresponding to the memory cells to be accessed next can be precharged by the second precharge circuit 211b. Accordingly, access to the bit lines can be performed at a satisfactory efficiency.

The semiconductor memory device 202 has a drawback in that, although the number of the sensing amplifiers 212 and the data registers 213 is decreased, the chip is enlarged because the number of precharge circuits is increased.

Specifically, in a semiconductor memory device including 16 data output lines, the memory area is divided into 16 regions. Accordingly, 16 circuit configurations such as the one shown in FIG. 13 are provided. Namely, two precharge circuits 211a and 211b are required for each data output, i.e., for each memory cell array 10. In such a semiconductor memory device, 32 precharge circuits are then required, and thus the chip is enlarged.

As can be appreciated from the above description, when data is read continuously at a speed of about 30 ns per cycle or higher, the required number of sensing amplifiers and data registers is increased in the conventional semiconductor memory device 201 shown in FIG. 12. In the conventional semiconductor memory device 202 shown in FIG. 13, the size or number of the precharge circuits is increased, thus also enlarging the chip.

SUMMARY OF THE INVENTION

According to one aspect of the present invention, a semiconductor memory device includes a plurality of memory cells arranged in a matrix, each of which has a gate electrode, a first electrode and a second electrode. The semiconductor memory device also includes a plurality of word lines, at least one of which is connected to the gate electrode of one of the plurality of memory cells, a plurality of bit lines, at least one of which is connected to the first electrode of one of the plurality of memory cells, and a plurality of virtual ground lines, at least one of which is connected to the second electrode of one of the plurality of memory cells. The semiconductor memory device further includes a determination circuit for generating a determination signal based on an address signal and a precharge and access circuit for applying one of a first voltage and a second voltage to at least one of the plurality of bit lines and for applying one of a third voltage and a fourth voltage to at least one of the plurality of virtual ground lines, based on the determination signal.

In one embodiment of the invention, the plurality of memory cells are divided into a plurality of memory blocks.

In one embodiment of the invention, the determination circuit determines, based on the address signal, whether to provide a bit line in one of the plurality of memory blocks with the first voltage or the second voltage and whether to provide a virtual ground line in the one of the plurality of memory blocks with the third voltage or the fourth voltage.

In one embodiment of the invention, the precharge and access circuit provides a bit line in the memory block including a memory cell to be accessed with the second voltage, which is lower than the first voltage by a prescribed value, and provides a virtual ground line in the memory block including the memory cell to be accessed with a ground voltage potential.

In one embodiment of the invention, the precharge and access circuit provides a bit line in the memory block including a memory cell to be accessed with the second voltage, which is lower than the first voltage by a prescribed value, and provides a virtual ground line in the memory block including the memory cell to be accessed with a voltage of a level higher than a ground potential by a prescribed value.

In one embodiment of the invention, the first voltage is equal to the third voltage, the second voltage is lower than the first voltage by a prescribed value, and the fourth voltage has a ground potential.

Alternatively, the first electrode is a drain electrode and the second electrode is a source electrode.

In one embodiment of the invention, the first electrode is a source electrode and the second electrode is a drain electrode.

According to another aspect of the present invention, a method for accessing data in a memory cell in a semiconductor memory device having a plurality of memory cells divided into a plurality of memory blocks includes the steps of putting a bit line and a virtual ground line connected to each of a plurality of first memory cells in first memory blocks into a prechargeable state; putting a bit line and a virtual ground line connected to a second memory cell in a second memory block which needs to be accessed into an accessible state, and putting a bit line and a virtual ground line connected to at least one of the first memory cells in one of the first memory blocks which succeeds the second memory block into the accessible state while the second memory cell is being accessed.

According to still another aspect of the present invention, a method for accessing data in a memory cell in a semiconductor memory device having a plurality of memory cells divided into a plurality of memory blocks includes the steps of putting a bit line and a virtual ground line connected to a memory cell storing data included in a page to be accessed into an accessible state; and putting a bit line and a virtual ground line connected to a memory cell storing data included in other pages into a prechargeable state.

In one embodiment of the invention, the page includes data stored in an area from a first address to a second address.

Thus, the invention described herein makes possible an advantage of providing a semiconductor memory device and a method for accessing a memory in the semiconductor memory device for realizing high-speed and continuous data reading without enlarging the chip.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
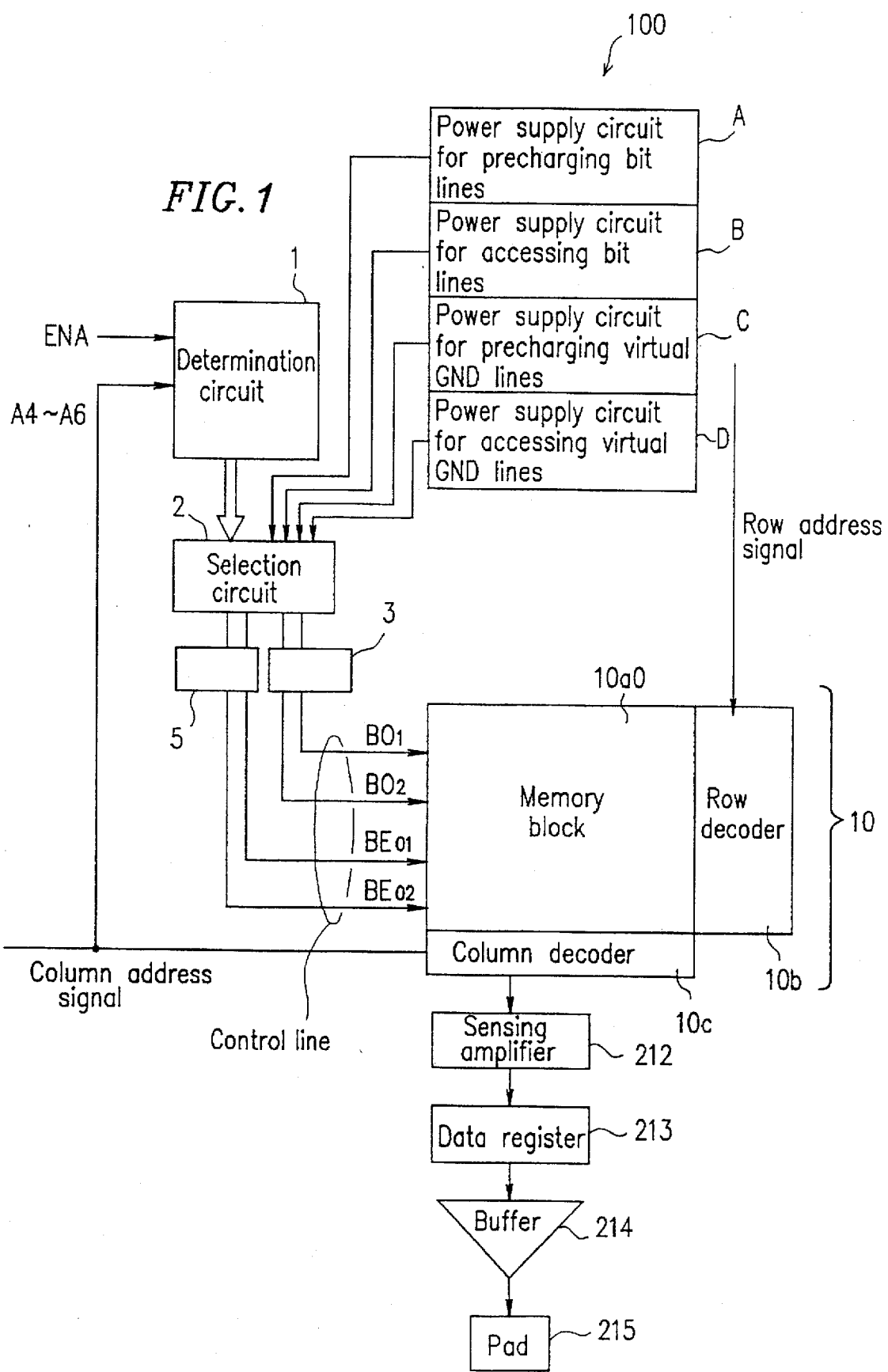
FIG. 1 is a schematic view of a semiconductor memory device in a first example according to the present invention.

With reference to FIG. 1, a semiconductor memory device 100 in a first example according to the present invention will be described.

The semiconductor memory device 100 in the first example includes a determination circuit 1, a selection circuit 2, a bit line precharge/access circuit 3, a virtual GND line precharge/access circuit 5, and a memory cell array 10.

The memory cell array 10 includes a memory cell block 10a0, a row decoder 10b, and a column decoder 10c. The memory block 10a0 includes a plurality of banks (not shown), and each bank includes a plurality of memory cells (not shown). As shown in, for example, FIG. 3, one of a drain electrode or a source electrode of each memory cell is connected to a bit line (represented by B0, etc.), and the other of the source electrode or the drain electrode of each memory cell is connected to a virtual GND line (represented by V0, etc.). Memory cells in the same column are connected to the same bit line and the same virtual GND line. Memory cells in the same row are connected to a common word line (represented by WL1, etc.). In this specification, "one of a drain electrode or a source electrode" will be referred to as the "drain/source electrode", and "the other of the drain electrode or the source electrode will be referred to as the "source/drain electrode".

The row decoder 10b is provided for activating or deactivating the word lines. The column decoder 10c is provided for activating or deactivating the bit lines and the virtual GND lines.

The determination circuit 1 is provided for determining, based on an ENA signal and column address signals A4, A5 and A6, whether or not the memory block 10a0 needs to be accessed immediately, and outputting a determination signal based on the determination. The ENA signal indicates a voltage value status of each word line. The ENA signal is generated by comparing a reference voltage and the voltage of the word line or pseudo word line (not shown). The comparison result is output as the ENA signal. For example, when the voltage of the word line becomes 80% of the reference voltage, the ENA signal becomes "high".

Access to the memory block 10a0 refers to access to a part of the bit lines (for example, ¼ of all the bit lines) in the memory block 10a0. If immediate access to the memory block 10a0 is not needed, no bit line in the memory block 10a0 is selected for accessing.

Figure 4:
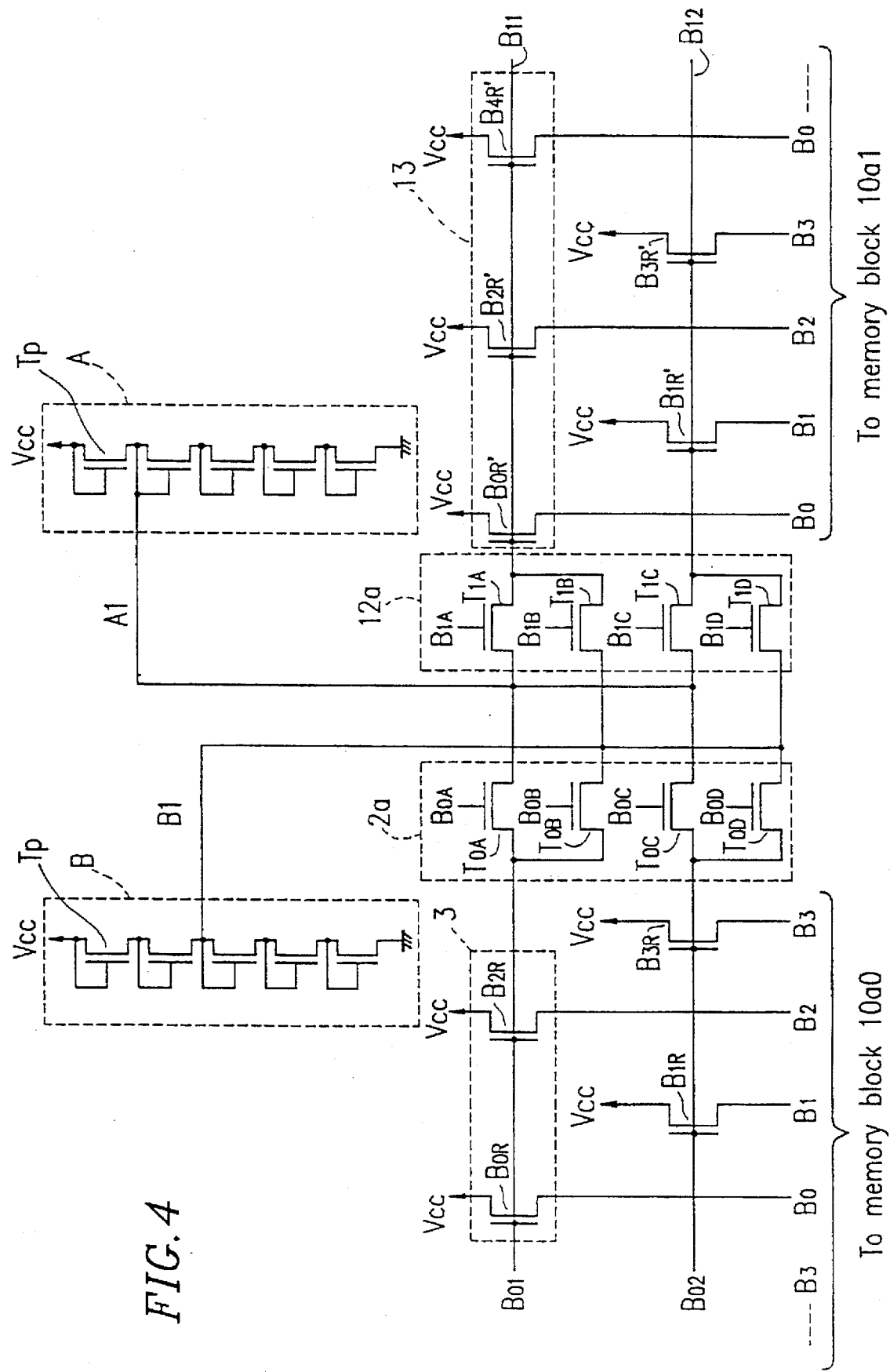
FIG. 4 is a circuit configuration of bit line selection circuits and the vicinity thereof in the semiconductor memory device shown in FIG. 2.
Figure 5:
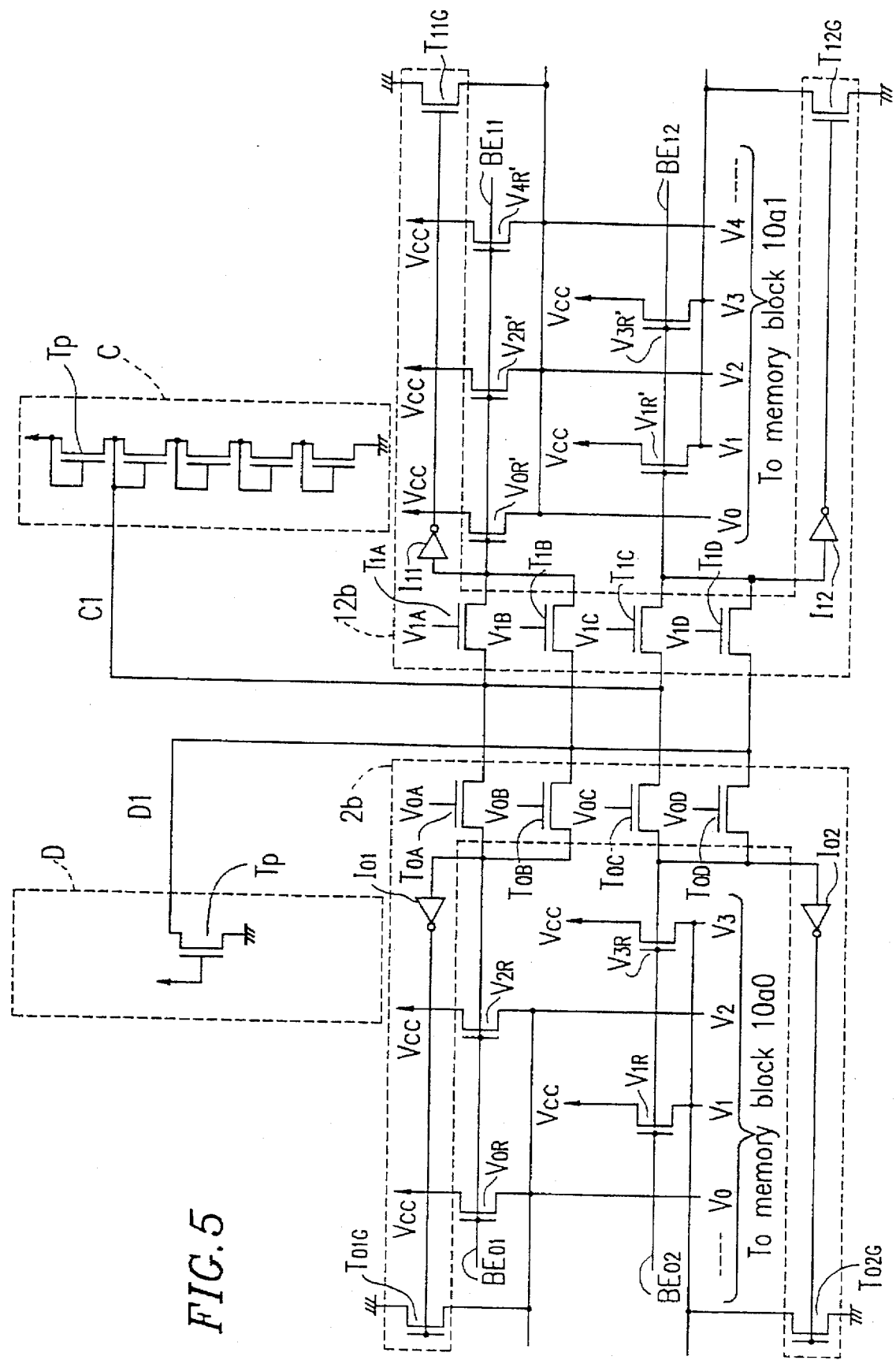
FIG. 5 is a circuit configuration of virtual GND line selection circuits and the vicinity thereof in the semiconductor memory device shown in FIG. 2.

The selection circuit 2 includes a bit line selection circuit 2a (for example, as shown in FIG. 4) and a virtual GND line selection circuit 2b (for example, as shown in FIG. 5). As shown in FIG. 4, the bit line selection circuit 2a is supplied with a voltage A1 or B1. The voltage A1 is supplied for precharging the bit lines, and the voltage B1 is supplied for the corresponding memory cells to be accessible. The bit selection circuit 2a selects one of the voltages A1 or B1 based on a determination signal from the determination circuit 1 (FIG. 1 and later described in conjunction with FIG. 6), and applies the selected voltage to the bit line precharge/access circuit 3. As shown in FIG. 5, the virtual GND line selection circuit 2b is supplied with a voltage C1 or D1. The voltage C1 is supplied for precharging the virtual GND lines, and the voltage D1 is supplied for the corresponding memory cells to be accessible. The virtual GND line selection circuit 2b selects one of the voltages C1 or D1 based on a determination signal from the determination circuit 1 (FIG. 1 and later described in conjunction with FIG. 7), and applies the selected voltage to the virtual GND line precharge/access circuit 5.

The bit line precharge/access circuit 3 sets the bit line to a precharge level (for example, ½ Vcc) or a level below the precharge level, based on the voltage selected by the bit line selection circuit 2a.

The virtual GND line precharge/access circuit 5 sets the bit line to a precharge level (for example, ½ Vcc) or a GND level (for example, 0 Vcc), based on the voltage selected by the virtual GND line selection circuit 2b.

The semiconductor memory device 100 can include four power supply circuits A, B, C and D respectively for supplying the voltages A1, B1, C1 and D1 to the selection circuit 2.

The semiconductor memory device 100 operates in the following manner when the determination circuit 1 determines that immediate access to the memory block 10a0 is not needed.

The determination circuit 1, when determining that immediate access to the memory block 10a0 is not needed based on the ENA signal and the column address signals A4, A5 and A6, outputs a determination signal representing the determination. The bit line selection circuit 2a applies the voltage A1 to the bit line precharge/access circuit 3 based on the determination signal from the determination circuit 1. The bit line precharge/access circuit 3 selects all the bit lines in the memory block 10a0 and applies the voltage A1 to the selected bit lines. The virtual GND line selection circuit 2b applies the voltage C1 to the virtual GND line precharge/access circuit 5 based on the determination signal from the determination circuit 1. The virtual GND line precharge/access circuit 5 selects all the virtual GND lines in the memory block 10a0 and applies the voltage C1 to the selected virtual GND lines. In this manner, precharge of the bit lines and the virtual GND lines is completed.

The semiconductor memory device 100 operates in the following manner when the determination circuit 1 determines that immediate access to the memory block 10a0 is needed.

The determination circuit 1, when determining that immediate access to the memory block 10a0 is needed based on the ENA signal and the column address signals A4, A5 and A6, outputs a determination signal representing the determination. In such a case, a portion of all the bit lines (¼ of all the bit lines in this example) connected to the memory block 10a0 are selected in the following manner. The bit line selection circuit 2a applies the voltage B1 to the bit line precharge/access circuit 3 based on the determination signal from the determination circuit 1. The bit line precharge/access circuit 3 selects a portion of all the bit lines (¼ of all the bit lines in this example) in the memory block 10a0 and applies the voltage B1 to the selected bit lines. The virtual GND line selection circuit 2b applies the voltage D1 to the virtual GND line precharge/access circuit 5 based on the determination signal from the determination circuit 1. The virtual GND line precharge/access circuit 5 selects a portion of all the virtual GND lines (¼ of all the virtual GND lines in this example) in the memory block 10a0 and applies the voltage D1 to the selected virtual GND lines.

After the voltage B1 is applied to the selected bit lines and the voltage D1 is applied to the selected virtual GND lines, the potential of the word line connected to the gate of the memory cell to be accessed rises. It is preferable that the voltages B1 and D1 be applied simultaneously.

When the word line connected to the memory cell becomes active, the memory cell is put into an "ON" state or an "OFF" state. When the memory cell is put into an "ON" state, the potential of the bit line connected to the memory cell moves to the GND potential. Even if the word line connected to the memory cell becomes active, if the memory cell is in an "OFF" state, the potential of such a bit line does not move to the GND potential. Thus, data stored in the memory cell is retrieved.

The retrieved data is amplified by the sensing amplifier 212 and then stored in the data register 213. The data stored in the data register 213 is output from the pad 215 through the buffer 214.

Figure 3:
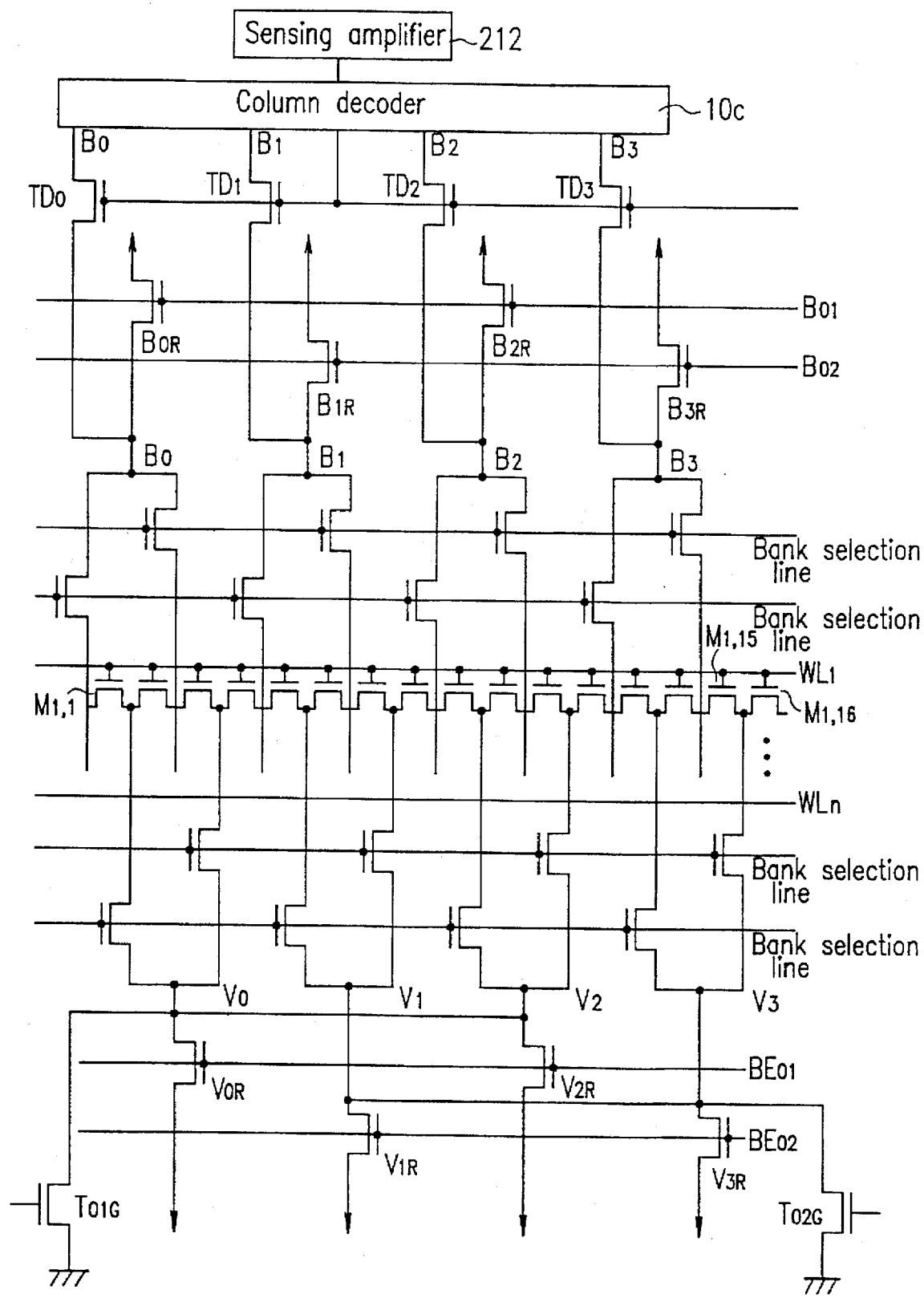
FIG. 3 is a schematic view of a memory cell array of the semiconductor memory device shown in FIG. 2.

Then, in the case where the memory block 10a0 has the configuration partially shown in FIG. 3, data stored in a memory cell Ma+4,b (not shown) which is the fourth memory cell in the horizontal direction (row direction) from the above-described memory cell Ma,b is read. The reason is that the bit lines connected to the memory cells which are the fourth (Ma+4,b), eighth (Ma+8,b), 12th (Ma+12,b), and 16th (Ma+16,b) memory cells (not shown) in the row direction from the memory cell Ma,b are provided with the voltage B1, and the virtual GND lines connected to those memory cells are provided with the voltage D1.

When the data stored in the memory cells provided with the voltages B1 and D1 are accessed, the data stored in the memory cells in the next row (above or below the row having the first memory cell) which are provided with the voltages B1 and D1 can be read.

In the first example, the voltage D1 from the power supply circuit D is supplied to the virtual GND lines through the virtual GND line precharge/access circuit 5. In a modification, a voltage of a GND level can be directly supplied to the virtual GND lines.

EXAMPLE 2

Figure 2:
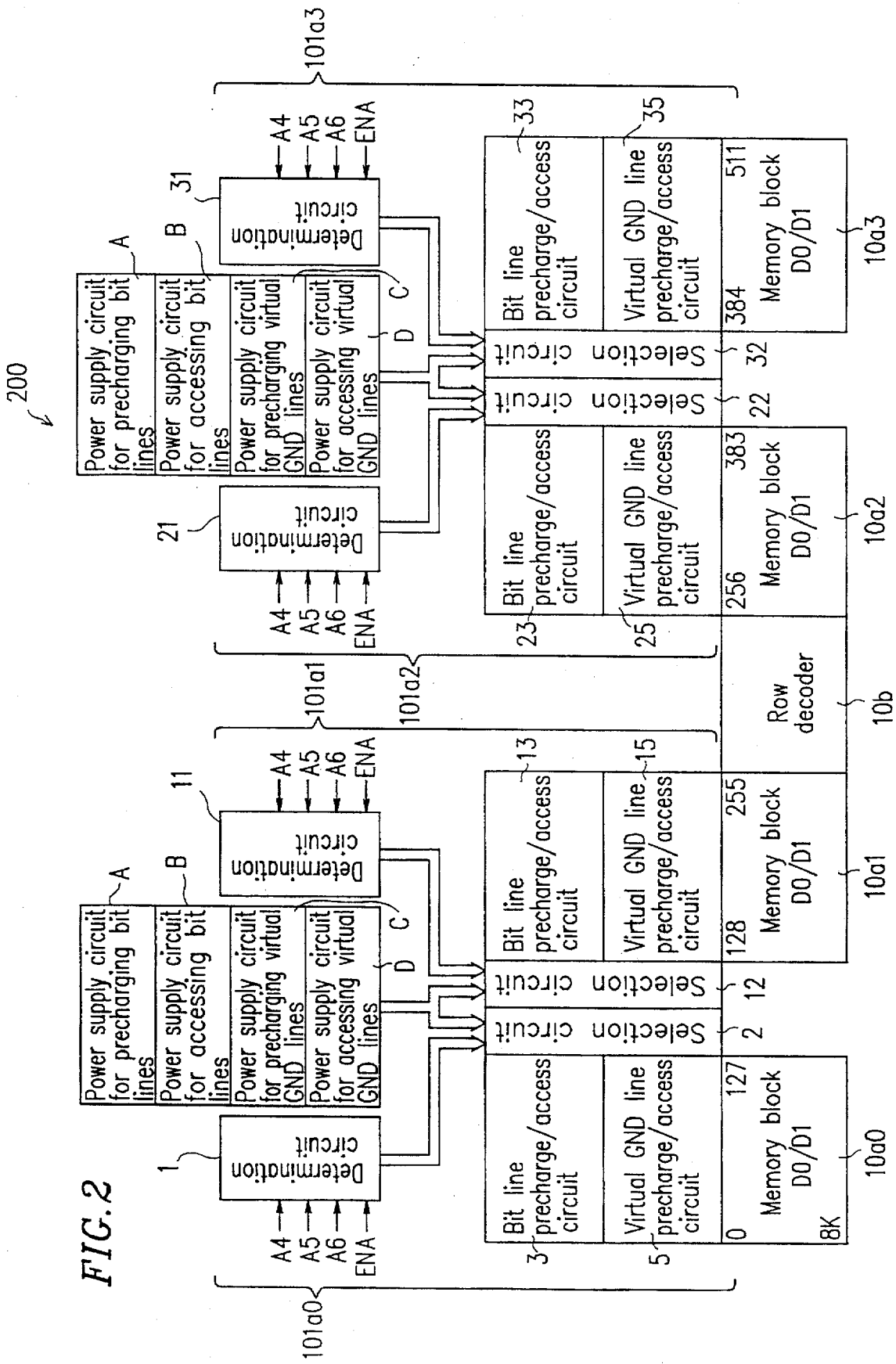
FIG. 2 is a schematic view of a semiconductor memory device in a second example according to the present invention.

With reference to FIG. 2, a semiconductor memory device 200 in a second example according to the present invention will be described. Identical elements as those in the first example will bear identical reference numerals therewith and the descriptions thereof will be omitted.

The semiconductor memory device 200 in the second example includes peripheral circuits 101a0, 101a1, 101a2 and 101a3. The peripheral circuit 101a0 includes a determination circuit 1, a selection circuit 2, a bit line precharge/access circuit 3, and a virtual GND line precharge/access circuit 5. The peripheral circuit 101a1 includes a determination circuit 11, a selection circuit 12, a bit line precharge/access circuit 13, and a virtual GND line precharge/access circuit 15. The peripheral circuit 101a2 includes a determination circuit 21, a selection circuit 22, a bit line precharge/access circuit 23, and a virtual GND line precharge/access circuit 25. The peripheral circuit 101a3 includes a determination circuit 31, a selection circuit 32, a bit line precharge/access circuit 33, and a virtual GND line precharge/access circuit 35. The peripheral circuits 101a0 and 101a1 may have common power supply circuits A, B, C and D. The peripheral circuits 101a2 and 101a3 likewise may have common power supply circuits A, B, C and D. The semiconductor memory device 200 further includes a memory cell including memory blocks 10a0, 10a1, 10a2 and 10a3, a row decoder 10b, and a column decoder 10c (FIG. 3). The memory block 10a0 is connected to the peripheral circuit 101a0, the memory block 10a1 is connected to the peripheral circuit 101a1, the memory block 10a2 is connected to the peripheral circuit 101a2, and the memory block 10a3 is connected to the peripheral circuit 101a3. The row decoder 10b is provided between the memory blocks 10a1 and 10a2, and selects a word line common for the memory blocks 10a0, 10a1, 10a2 and 10a3.

With reference to FIGS. 3, 4 and 5, a detailed structure of the memory cell array will be described.

As shown in FIG. 3, the memory cell array includes MOS transistors Mij (i=1, 2, ..., n; j=1, 2, ... 16), wherein "n" represents a positive integer, each acting as a memory cell. In the horizontal direction in FIG. 3 (row direction), a word line WL1 is connected to gates of the memory cells M1,1 through M1,16; and a word line WLn is connected to the memory cells Mn,1 through Mn,16 (not shown). In the vertical direction in FIG. 3 (column direction), bit lines B0 through B3 are connected to the drain/source electrode of their respective memory cells arranged in the column direction, and virtual GND lines V0 through V3 are connected to the source/drain electrode of their respective memory cells arranged in the column direction.

As shown in FIG. 4, the bit lines B0 through B3 are connected to a power supply Vcc through load-resistive transistors B0R through B3R. The bit lines B0 through B3 are also connected to a sensing amplifier 212 through the column decoder 10c and the output transistors TD0 through TD3 of FIG. 3.

The gates of the load-resistive transistors B0R and B2R are connected to a control line B01. The gates of the load-resistive transistors B1R and B3R are connected to a control line B02. The gates of the output transistors TD0 through TD3 each receive a control signal from the column decoder 10c (FIG. 3), which generates a control signal based on an address signal. When the address signal represents an address of a memory cell to be accessed, the column decoder 10c generates a control signal to turn "ON" the corresponding output transistor TDn; otherwise, the column decoder 10c generates a control signal to turn "OFF" the corresponding output transistor TDn.

As shown in FIG. 5, the virtual GND lines V0 through V3 are connected to the power supply Vcc through load-resistive transistors V0R through V3R. The virtual GND lines V0 and V2 are connected to the GND potential through a GND-side load transistor T01G of FIG. 3. The virtual GND lines V1 and V3 are connected to the GND potential through a GND-side load transistor T02G also illustrated in FIG. 3.

The gates of the load-resistive transistors V0R and V2R are connected to a control line BE01. The gates of the load-resistive transistors V1R and V3R are connected to a control line BE02. The gates of the GND-side load transistors T01G and T02G respectively receive an inverted level of the potentials of the control lines BE01 and BE02.

Figure 6:
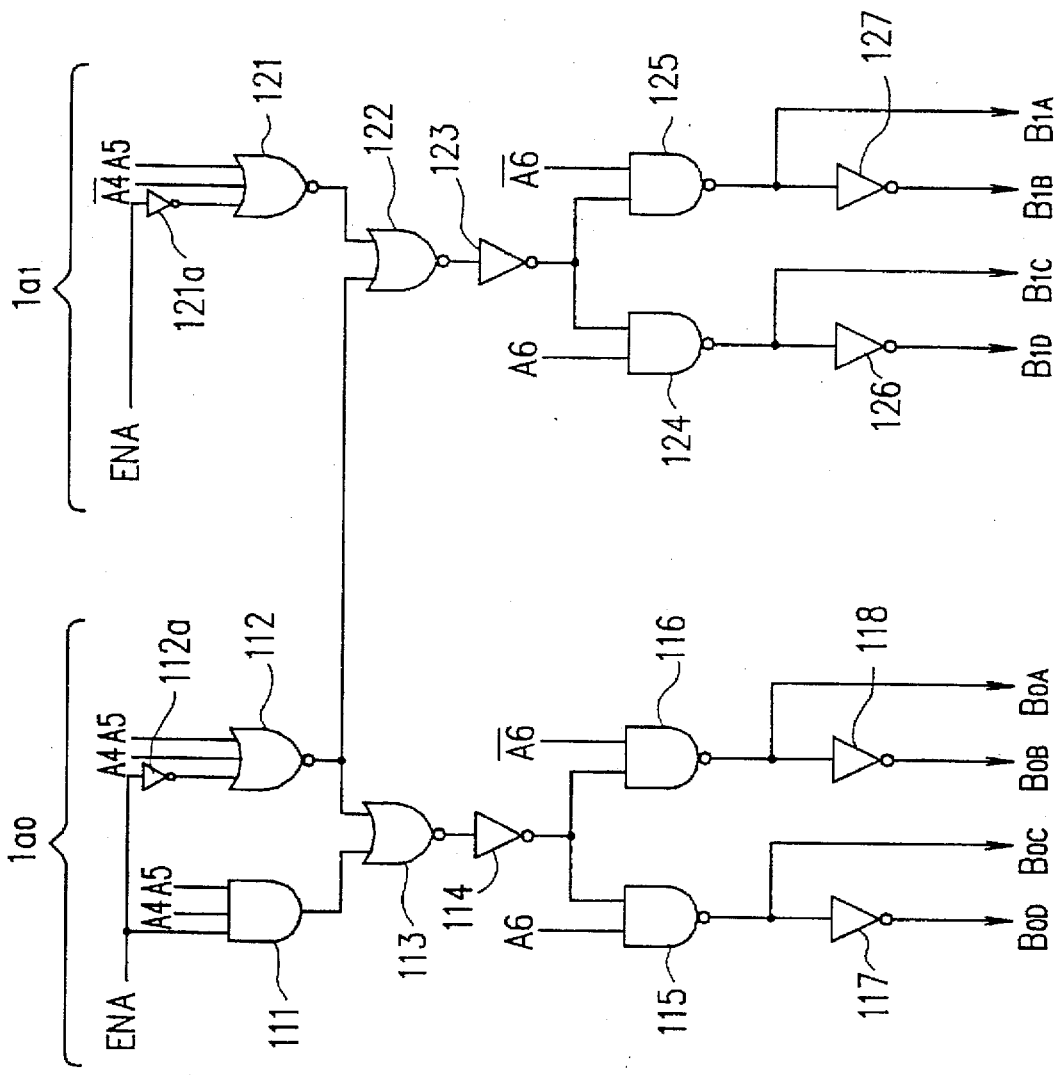
FIG. 6 is a circuit configuration of bit line determination circuits of the semiconductor memory device shown in FIG. 2.
Figure 7:
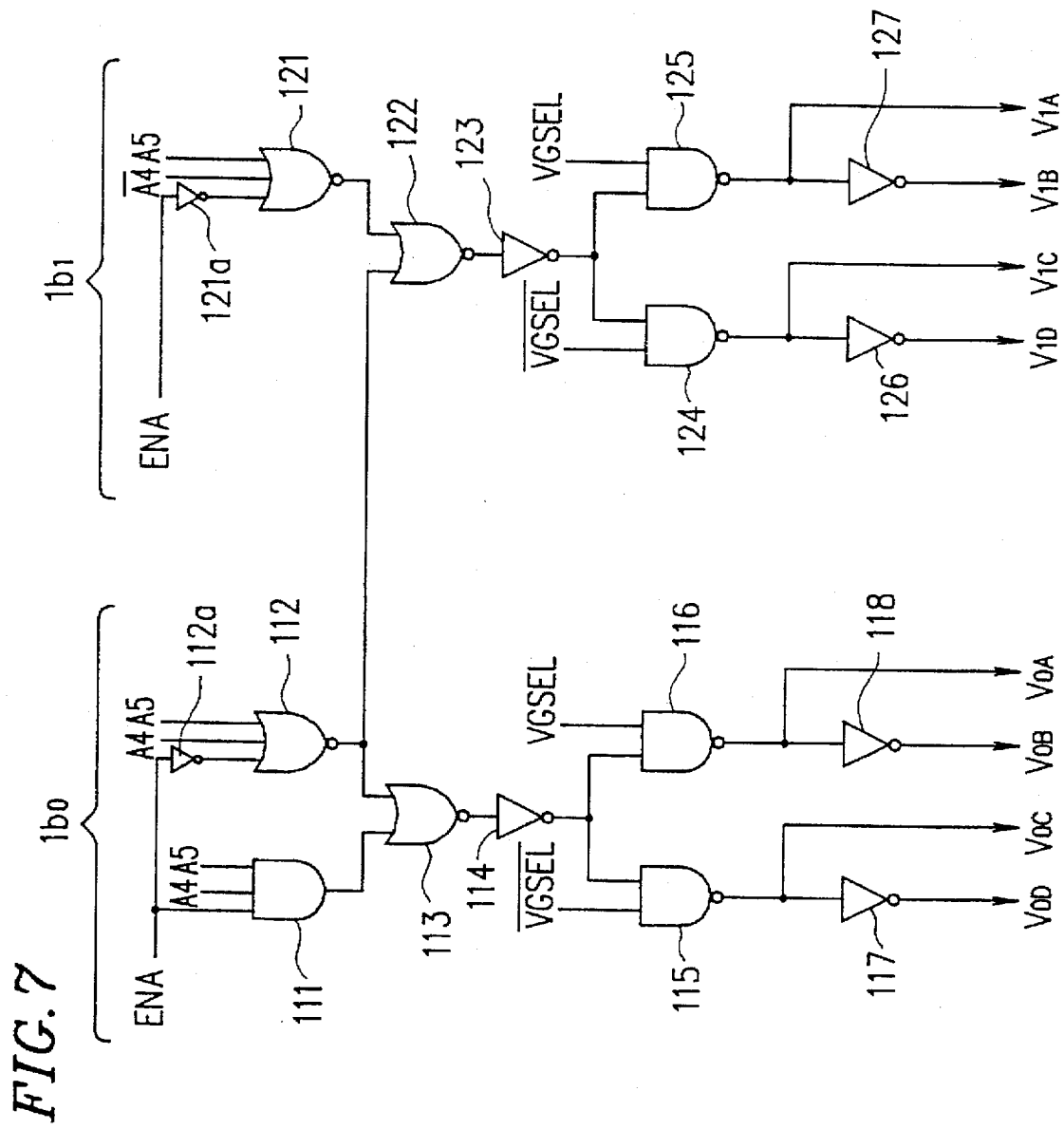
FIG. 7 is a circuit configuration of virtual GND line determination circuits of the semiconductor memory device shown in FIG. 2.

The determination circuit 1 includes a bit line determination circuit 1a0 (FIG. 6) and a virtual GND determination circuit 1b0 (FIG. 7). The determination circuit 11 includes a bit line determination circuit 1a1 (FIG. 6) and a virtual GND determination circuit 1b1 (FIG. 7).

FIG. 6 shows the bit line determination circuits 1a0 and 1a1, corresponding respectively to the memory blocks 10a0 and 10a1.

The bit line determination circuit 1a0 includes a 3-input AND circuit 111 for receiving an ENA signal and the column address signals A4 and A5, an inverter 112a for inverting the ENA signal, a 3-input NOR circuit 112 for receiving the output from the inverter 112a and the column address signals A4 and A5. The bit line determination circuit 1a0 also includes a 2-input NOR circuit 113 for receiving the outputs from the 3-input AND circuit 111 and the 3-input NOR circuit 112, and an inverter 114 for inverting the output from the 2-input NOR circuit 113.

The bit line determination circuit 1a0 further includes a 2-input NAND circuit 115 for receiving the output from the inverter 114 and a column address signal A6, a 2-input NAND circuit 116 for receiving the output from the inverter 114 and a signal A6(bar), which is an inverted signal of the column address signal A6, an inverter 117 for inverting the output from the 2-input NAND circuit 115, and an inverter 118 for inverting the output from the 2-input NAND circuit 116.

Output signals B0C and B0A from the NAND circuits 115 and 116 and output signals B0D and B0B from the inverters 117 and 118 are determination signals, upon which the selection circuit 2 selects a voltage to be applied to the bit line precharge/access circuit 3.

The bit line determination circuit 1a1 includes an inverter 121a for inverting the ENA signal, a 3-input NOR circuit 121 for receiving the output from the inverter 121a, the column address signal A5, and a signal A4(bar), which is an inverted signal of the column address signal A4, a 2-input NOR circuit 122 for receiving the output from the 3-input NOR circuit 121 and the output from the 3-input NOR circuit 112 of the determination circuit 1a0, and an inverter 123 for inverting the output from the 2-input NOR circuit 122.

The bit line determination circuit 1a1 further includes a 2-input NAND circuit 124 for receiving the output from the inverter 123 and the column address signal A6, a 2-input NAND circuit 125 for receiving the output from the inverter 123 and the column address signal A6(bar), an inverter 126 for inverting the output from the 2-input NAND circuit 124, and an inverter 127 for inverting the output from the 2-input NAND circuit 125.

Output signals B1C and B1A from the NAND circuits 124 and 125 and output signals B1D and B1B from the inverters 126 and 127 are determination signals, upon which the selection circuit 12 selects a voltage to be applied to the bit line precharge/access circuit 13.

The virtual GND line determination circuit will be described with reference to FIG. 7.

FIG. 7 shows bit line determination circuits 1b0 and 1b1 respectively corresponding to the memory blocks 10a0 and 10a1.

The virtual GND line determination circuit 1b0 has the same structure as that of the bit line determination circuit 1a0 except that the 2-input NAND circuits 116 and 115 respectively receive a virtual GND line selection signal VGSEL and an inverted signal VGSEL(bar) instead of the signals A6(bar) and A6. The virtual GND line determination circuit 1b1 has the same structure as that of the bit line determination circuit 1a1 except that the 2-input NAND circuits 125 and 124 respectively receive a virtual GND line selection signal VGSEL and an inverted signal VGSEL(bar) instead of the signals A6(bar) and A6. The virtual GND line selection signals VGSEL and VGSEL(bar) are generated based on the column address signals A4, A5 and A6.

Returning to FIG. 4, a structure of the power supply circuits a and B will be described.

As shown in FIG. 4, the power supply circuits A and B each include five n-channel diode-connected transistors TP connected in series between the power supply Vcc and the GND potential. The power supply circuit A is provided for precharging the bit lines, and the power supply circuit B is provided for accessing the bit lines.

In the power supply circuit A, the voltage A1 for precharging the bit lines is provided at a connection point between the first and second transistors TP from Vcc. In other words, the voltage A1 has a value of Vcc×4/5. In the power supply circuit B, the voltage B1 for accessing the bit lines is provided at a connection point between the second and third transistors TP from Vcc. In other words, the voltage B1 has a value of Vcc×3/5.

The selection circuit 2 includes a bit line selection circuit 2a and a virtual GND line selection circuit 2b. Still referring to FIG. 4, a structure of the bit line selection circuit 2a will be described.

The bit line selection circuit 2a includes selection transistors T0A through T0D. The gates of the selection transistors T0A through T0D respectively receive selection signals B0A through B0D from the determination circuit 1 (as illustrated in FIG. 6). The selection transistors T0A and T0B are both connected to an output of the power supply circuit A and the control line B01. The selection transistors T0C and T0D are both connected to an output of the power supply circuit B and the control line B02.

Based on the selection signal B0A through B0D from the determination circuit 1, the voltage A1 is generated by the power supply circuit A or the voltage B1 is generated by the power supply circuit B and supplied to the load-resistive transistors B0R and B2R through the control line B01.

When the voltage A1 from the power supply circuit A is selected, the drive capability of the load-resistive transistors B0R and B2R corresponding to the control line B01 is of a prescribed value. The reason is that bit lines B0 and B2 are respectively connected to the load-resistive transistors B0R and B2R and each are supplied with a potential of about ½ Vcc as a precharge level.

When the voltage B1 from the power supply circuit B is selected, the drive capability of the load-resistive transistors B0R and B2R corresponding to the control line B01 is smaller than in the case where the voltage A1 is selected. The reason is that the bit lines B0 and B2 are respectively connected to the load-resistive transistors B0R and B2R and each are supplied with a potential, as an access voltage level, which is lower than about ½ Vcc by a prescribed value.

The load-resistive transistors B1R and B3R operate in the same manner. When the voltage A1 from the power supply circuit a is selected, the drive capability of the load-resistive transistors B1R and B3R corresponding to the control line B02 is of a prescribed value. The reason is that bit lines B1 and B3 are respectively connected to the load-resistive transistors B1R and B3R and each are supplied with a potential of about ½ Vcc as a precharge level.

When the voltage B1 from the power supply circuit B is selected, the drive capability of the load-resistive transistors B1R and B3R corresponding to the control line B02 is smaller than in the case where the voltage A1 is selected. The reason is that the bit lines B1 and B3 are respectively connected to the load-resistive transistors B1R and B3R and each are supplied with a potential, as an access voltage level, which is lower than about ½ Vcc by a prescribed value.

The selection circuit 12 of FIG. 2 includes a bit line selection circuit 12a and a virtual GND line selection circuit 12b. Still referring to FIG. 4, a structure of the bit line selection circuit 12a will be described.

The bit line selection circuit 12a includes selection transistors T1A through T1D. The gates of the selection transistors T1A through T1D respectively receive selection signals B1A through B1D from the determination circuit 11. The selection transistors T1A and T1B are both connected to an output of the power supply circuit A and the control line B11. The selection transistors T1C and T1D are both connected to an output of the power supply circuit B and the control line B12. The operation of the bit line selection circuit 12a is the same as that of the bit line selection circuit 2a and the description thereof will be omitted here.

Returning to FIG. 5, a structure of the power supply circuits C and D will be described.

As shown in FIG. 5, the power supply circuit C includes five n-channel diode-connected transistors TP connected in series between the power supply Vcc and the GND potential. The power supply circuit D includes one transistor TP. The drain/source electrode of the one transistor TP of the power supply circuit D is grounded, and the gate thereof is supplied with a power supply voltage Vcc. The power supply circuit C is provided for precharging the virtual GND lines, and the power supply circuit D is provided for accessing the virtual GND lines.

In the power supply circuit C, the voltage C1 for precharging the virtual GND lines is provided at a connection point between the first and second transistors from Vcc. In the power supply circuit D, the voltage D1 for accessing the virtual GND lines is provided at the source/drain electrode of the transistor TP.

Still referring to FIG. 5, a structure of the virtual GND line selection circuit 2b will be described.

The virtual GND line selection circuit 2b includes selection transistors T0A through T0D, inverters I01 and I02, and the GND-side load transistors T01G and T02G. The gates of the selection transistors T0A through T0D respectively receive selection signals V0A through V0D from the determination circuit 1.

The drain/source electrode of the selection transistor T0A is connected to an output of the power supply circuit C, and the source/drain electrode of the selection transistor T0A is connected to the control line BE01 and the inverter I01. The drain/source electrode of the selection transistor T0B is connected to an output of the power supply circuit D, and the source/drain electrode of the selection transistor T0B is connected to the control line BE01 and the inverter I01.

The drain/source electrode of the selection transistor T0C is connected to an output of the power supply circuit C, and the source/drain electrode of the selection transistor T0C is connected to the control line BE02 and the inverter I02. The drain/source electrode of the selection transistor T0D is connected to an output of the power supply circuit D, and the source/drain electrode of the selection transistor T0D is connected to the control line BE02 and the inverter I02.

The inverters I01 and I02 respectively invert the potentials of the control lines BE01 and BE02. The outputs of the inverters I01 and I02 are respectively connected to the gates of the GND-side load transistors T01G and T02G.

Still referring to FIG. 5, a structure of the virtual GND line selection circuit 12b will be described.

The virtual GND line selection circuit 12b includes selection transistors T1A through T1D, inverters I11 and I12, and GND-side resistive transistors T11G and T12G. The gates of the selection transistors T1A through T1D respectively receive selection signals V1A through V1D from the determination circuit 11.

The drain/source electrode of the selection transistor T1A is connected to an output of the power supply circuit C, and the source/drain electrode of the selection transistor T1A is connected to the control line BE11 and the inverter I11. The drain/source electrode of the selection transistor T1B is connected to an output of the power supply circuit D, and the source/drain electrode of the selection transistor T1B is connected to the control line BE11 and the inverter I11.

The drain/source electrode of the selection transistor T1C is connected to an output of the power supply circuit C, and the source/drain electrode of the selection transistor T1C is connected to the control line BE12 and the inverter I12. The drain/source electrode of the selection transistor T1D is connected to an output of the power supply circuit D, and the source/drain electrode of the selection transistor T1D is connected to the control line BE12 and the inverter I12.

The inverters I11 and I12 respectively invert the potentials of the control lines BE11 and BE12. The outputs of the inverters I11 and I12 are respectively connected to the gates of the GND-side resistive transistors T11G and T12G.

Data reading is performed by the semiconductor memory device 200 and will be described regarding two different states of the column addresses.

When the determination circuit 1 determines, based on the column address signals A4 through A6, that immediate access to the memory block 10a0 is not necessary, the selection circuit 2 receives a determination signal from the determination circuit 1 and activates the bit line precharge/access circuit 3 and the virtual GND precharge/access circuit 5.

Specifically, the bit line selection circuit 2a applies the voltage A1 output from the power supply circuit A provided for precharging the bit lines to the control lines B01 and B02, thereby providing the load-resistive transistors B0R, B2R, B1R and B3R with a voltage which is sufficient to provide the bit lines B01, B02, B03 and B04 with a precharge level (½ Vcc).

The virtual GND line selection circuit 2b applies the voltage C1 output from the power supply circuit C provided for precharging the virtual GND lines to the control lines BE01 and BE02, thereby providing the load-resistive transistors V0R, V2R, V1R and V3R with a prescribed level of voltage and turning "OFF" the GND-side load transistors T01G and T02G. Thus, the virtual GND lines V0 through V3 obtain a precharge level (½ Vcc).

In this manner, all the bit lines and all the virtual GND lines in the memory block 10a0 can be provided with a voltage of a precharge level due to the bit line precharge/access circuit 3 and the virtual GND line precharge/access circuit 5. In order to compensate for a voltage drop in the bit lines and virtual GND lines, the electric characteristics of the load-resistive transistors and/or the voltages A1 and C1 can be adjusted so that the bit lines and the virtual GND lines obtain a prescribed voltage level.

When the determination circuit 1 determines, based on the column address signals A4 through A6, that immediate access to the memory block 10a0 is necessary, the bit line selection circuit 2b applies the voltage B1 output from the power supply circuit B provided for accessing the bit line to a prescribed control line, based on the determination signal from the determination circuit 1. Since the voltage B1 is slightly lower than the voltage A1 (for example, the voltage B1 is lower than the voltage A1 by about ¼ of the voltage A1), the drive capability of the load-resistive transistors connected to the prescribed control line are reduced proportionally to about ¼ of the voltage A1. Thus, the bit line to be accessed obtains a voltage which is proportionally lower than ½ Vcc.

The virtual GND line to be accessed is supplied with a voltage of a GND level potential by the virtual GND precharge/access circuit 5, and thus the memory cells in the memory block 10a0 are accessed sequentially.

Specifically, the virtual GND line selection circuit 2b applies the voltage D1 output from the power supply circuit D provided for accessing the virtual GND line to a prescribed control line, based on the determination signal from the determination circuit 1. Thus, the load-resistive transistors connected to the prescribed control line are turned "OFF", thereby separating the virtual GND line to be accessed from the power supply Vcc; and the corresponding GND-side transistors are turned "ON", thereby connecting the virtual GND line to the GND potential.

When data in a memory cell is accessed, the word line connected to the gate of the memory cell is "ON", namely, the word line transistor is "ON". When the word line connected to the memory cell becomes active, the memory cell is put into an "ON" state or an "OFF" state. When the memory cell is put into an "ON" state, the potential of the bit line connected to the memory cell moves to the GND potential. Even if the word line connected to the memory cell becomes active, if the memory cell is in an "OFF" state, the potential of such a bit line does not move to the GND potential.

The operation of the semiconductor memory device 200 will be described in detail.

While an ENA signal is "low", all the bit lines and all the virtual GND lines in the memory blocks 10a0 through 10a3 are provided with a precharge voltage level. The word line runs across the memory blocks 10a0 through 10a3 and is connected to the memory cells in the memory blocks 10a0 through 10a3. While the ENA signal is "high", whether all the bit lines and all the virtual GND lines in the memory blocks 10a0 through 10a3 are provided with a precharge voltage level or an access voltage level is determined based on the column address signals.

When the column address signals (A4, A5, A6) input to the determination circuit 1 are (0, 0, 0), namely, when the memory block 10a0 is to be accessed, the bit line precharge/access circuit 3 provides a desired bit line with a voltage required for accessing the corresponding memory cell in the memory block 10a0. The voltage of all the other bit lines are substantially maintained at the precharge voltage level. The virtual GND line precharge/access circuit 5 provides the desired virtual GND lines with a GND level voltage. When the memory cells are accessed, the voltage of the virtual GND lines is always at the GND level.

When the word line connected to the gate of the memory cell is activated and the memory cell is turned "ON", the bit line connected to the memory cell is electrically connected to the virtual GND line at the GND level through the memory cell. Accordingly, the voltage of the bit line is lower than the precharge voltage level. When the word line is activated, but the memory cell is not turned "ON", the bit line connected to the memory cell is not electrically connected to the virtual GND line. Accordingly, the voltage of the bit line is substantially maintained at the precharge voltage level.

Then, the sensing amplifier 212 becomes active when the memory block 10a0 is activated. Specifically, the sensing amplifier 212 senses the potential of the bit line connected to the memory cell storing the data to be read about several tens of nanoseconds after the word line connected to the gate of the memory cell becomes active. The sensing amplifier may be provided in correspondence with each memory block.

Figure 8:
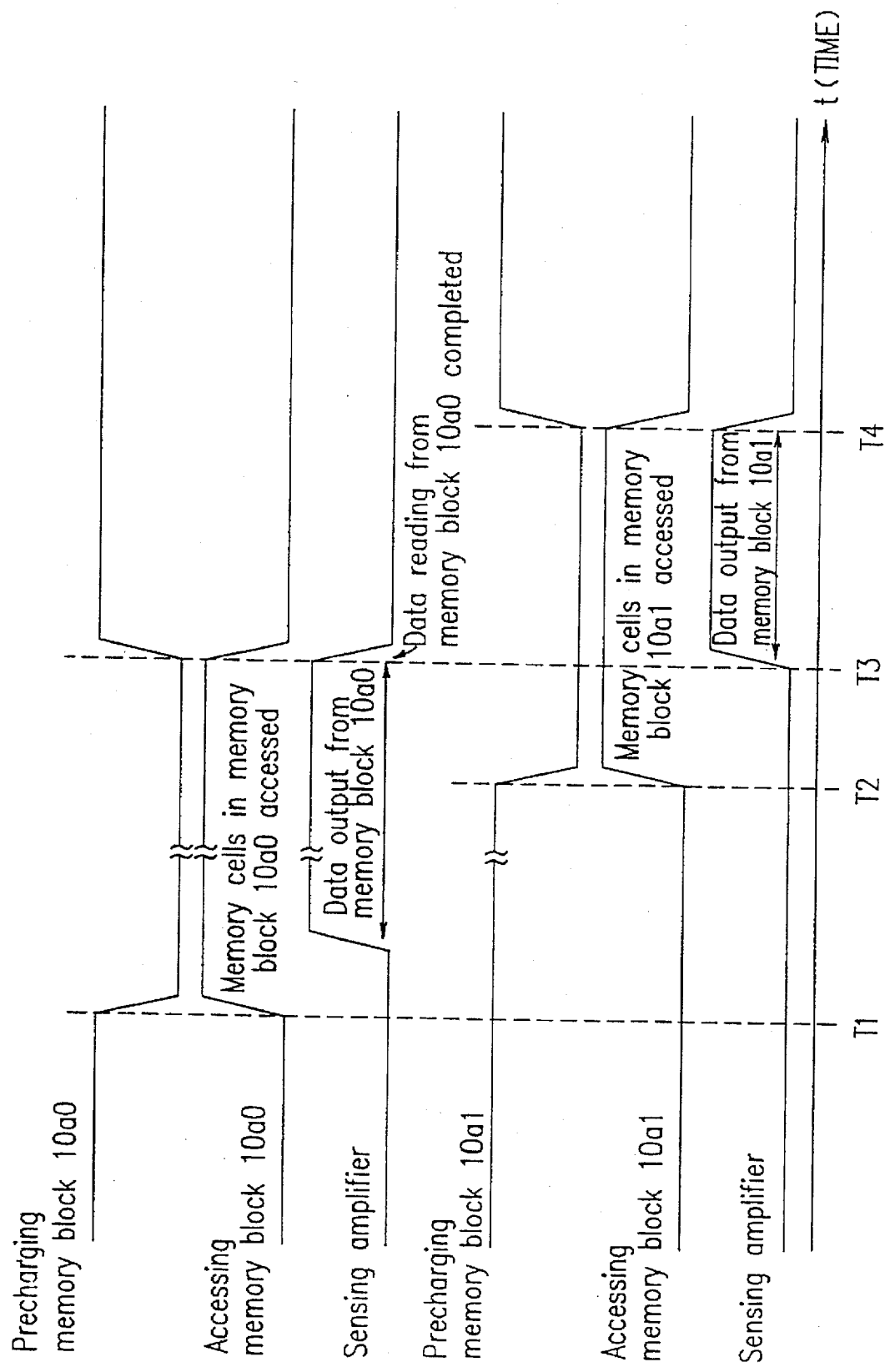
FIG. 8 is a timing diagram illustrating the operation of the semiconductor memory device shown in FIG. 2.

With reference to FIG. 8, operational timing of semiconductor memory device 200 will be described.

At time T1, precharge for the memory block 10a0 is completed, and access to the memory cells in the memory block 10a0 begins. At time T2, precharge for the memory block 10a1 is completed, and access to the memory cells in the memory block 10a1 begins. At time T3, the data transfer from the memory cells in the memory block 10a0 is completed. At time T4, the data transfer from the memory cells in the memory block 10a1 is completed. The transferred data is sensed by activating the sensing amplifier 212.

When the column address signals (A4, A5, A6) input to the determination circuit 11 corresponding to the memory block 10a1 are (0, 0, 1), the determination circuit 11 controls the corresponding selection circuit 12 to activate the bit line precharge/access circuit 13. Thus, the voltage of the desired corresponding bit lines is maintained at a precharge voltage level. The determination circuit 11 also controls the corresponding selection circuit 12 to activate the virtual GND line precharge/access circuit 15. Thus, the desired virtual GND lines are provided with a GND level voltage, and the potential of the corresponding bit line may move to the GND potential.

When the column address signals (A4, A5, A6) input to the determination circuit 11 corresponding to the memory block 10a1 are (0, 1, 0), the sensing amplifier (not shown) corresponding to the memory block 10a1 is activated, thereby amplifying the potential of the desired bit lines. Simultaneously, the desired virtual GND lines are provided with a GND level voltage, and the potential of the corresponding bit line may move to the GND potential.

During access of the memory block 10a2, data stored in the memory block 10a1 is being output, and no memory cell in the memory block 10a1 is selected.

The time period in which the data stored in the memory cells in the memory block 10a1 is output partially overlaps a time period in which the memory cells in the memory block 10a2 are accessed.

During such a time period in which the above-described operations overlap, sensing of the bit lines connected to the memory block 10a0 to amplify voltages of the bit lines, and access to the memory cells in the memory block 10a0 (e.g., access to the corresponding bit lines and virtual GND lines) are finished, and all the bit lines and the virtual GND lines in the memory block 10a0 are precharged, because the memory block 10a0 need not be accessed at this time. In other words, when the 128th column address signal is input, the sensing amplifier 212 completes amplification of all the bit lines in the memory block 10a0, and thus all the bit lines and all the virtual GND lines in the memory block 10a0 are precharged.

When the 256th column address signal is input, the sensing amplifier (not shown) completes amplification of all the bit lines in the memory block 10a1, and thus all the bit lines and the virtual GND lines in the memory block 10a1 are precharged.

Hereinafter, the bit line determination circuits 1a0 and 1b1, the bit line selection circuits 2a and 12a, the virtual GND line determination circuits 1b0 and 1b1, and the virtual GND line selection circuits 2b and 12b operate in the following manner in detail.

The bit line selection circuit 2a (FIG. 4) receives signals B0A, B0B, B0C and B0D (FIG. 6) from the bit line determination circuit 1a0 and selects a voltage to be applied to the bit line precharge/access circuit 3 corresponding to the memory block 10a0 based on the signals B0A, B0B, B0C and B0D. The bit line selection circuit 12a (FIG. 4) receives signals B1A, B1B, B1C and B1D (FIG. 6) from the bit line determination circuit 1a1 and selects a voltage to be applied to the bit line precharge/access circuit 13 corresponding to the memory block 10a1 based on the signals B1A, B1B, B1C and B1D.

The virtual GND line selection circuit 2b (FIG. 5) receives signals V0A, V0B, V0C and V0D (FIG. 7) from the virtual GND line determination circuit 1b0 and selects a voltage to be applied to the virtual GND line precharge/access circuit 5 corresponding to the memory block 10a0 based on the signals V0A, V0B, V0C and V0D. The virtual GND line selection circuit 12a (FIG. 5) receives signals V1A, V1B, V1C and V1D (FIG. 7) from the virtual GND line determination circuit 1b1 and selects a voltage to be applied to the bit line precharge/access circuit 15 corresponding to the memory block 10a1 based on the signals V1A, V1B, V1C and V1D.

When the column address signals (A4, A5, A6) are (0, 0, 0), the signals from the bit line determination circuit 1a0 are B0A=L, B0B=H, B0C=H, and B0D=L. Since B0B=H, the voltage B1 output from the power supply circuit B is input to the gates of the load-resistive transistors B0R and B2R respectively connected to the bit lines B0 and B2. In order to maintain the precharge voltage level of the bit lines B0 and B2, the level of the output voltage B1 is adjusted by changing the number of the load-resistive transistors TP (FIG. 4).

Since B0C=H, the voltage A1 output from the power supply circuit A is input to the gates of the load-resistive transistors B1R and B3R respectively connected to the bit lines B1 and B3. Since the level of the voltage A1 is higher than that of the voltage B1, the voltage of the bit lines B1 and B3 is maintained at a precharge voltage level. In other words, the memory cells connected to the bit lines B1 and B3 become accessible.

The signals from the virtual GND line determination circuit 1b0 are V0A=L (VGSEL(bar)), V0B=H (VGSEL), V0C=H, and V0D=L. Since V0B=H, the voltage D1 output from the power supply circuit D is input to the gates of the load-resistive transistors V0R and V2R respectively which are connected to the virtual GND lines V0 and Furthermore, an inverted signal of the voltage D1 is input to the gate of the GND-side load transistor T01G. Thus, the virtual GND lines V0 and V2 are connected to the GND potential, and a desired memory cell is accessed.

Since V0C=H, the voltage C1 output from the power supply circuit C is input to the gates of the load-resistive transistors V1R and V3R respectively which are connected to the bit lines V1 and V3. Furthermore, an inverted signal of the voltage C1 is input to the gate of the GND-side load transistor T02G. Thus, the voltage of the virtual GND lines V1 and V3 is maintained at a precharge voltage level.

For the memory block 10a1, the bit line selection circuit 12a is controlled based on the outputs B1A, B1B, B1C and B1D from the bit line determination circuit 1b1. The virtual GND line selection circuit 12b is controlled based on the outputs V1A, V1B, V1C and V1D from the virtual GND line determination circuit 1b1. Thus, a voltage to be applied to the bit line precharge/access circuit 13 is selected, and a voltage to be applied to the virtual GND line precharge/access circuit 15 is selected.

For reading data stored in the memory cell M11 in FIG. 3, the voltage B1 for allowing the voltage of the bit line to be maintained at a precharge voltage level is supplied to the control line B01. Furthermore, the voltage A1 for stably supplying the bit line with a precharge voltage level is supplied to the control line B02. Here, the voltage A1 has a higher voltage level than that of the voltage B1. A GND level voltage is supplied to the control line BE01, and the voltage C1 (=A1) for stably supplying the virtual GND line with a precharge voltage level is supplied to the control line BE02.

Data reading is performed within a time period from when a column address signal corresponding to a memory block different from the memory block including the memory cell M11 is input to the column decoder 10c until when the column address is decoded by the column decoder 10c. Therefore, in the semiconductor memory device 200, high-speed random reading of data in a page is possible. When the bit lines selected by the column decoder are connected to the sensing amplifier 212, the bit line potential is established. Accordingly, the semiconductor memory device 200 requires only one sensing amplifier for realizing the page mode operation, whereas a conventional semiconductor memory device requires a plurality of sensing amplifiers.

In the second example, the voltage D1 from the power supply circuit D is supplied to the virtual GND line precharge/access circuit 15 through the control line, but the GND level voltage can be directly supplied to the control line.

The semiconductor memory device 200 can operate in the following manner for reading data in, for example, the page mode. While the memory block 10a0 is accessed and the data from the memory block 10a0 are amplified, the memory cells in the memory block 10a1 are accessed (i.e., the precharge level of the bit lines is maintained and the GND level is supplied to the virtual GND lines) to establish a sufficient difference between the bit line voltage and the reference voltage. By such an operation, the time period for reading the data can be further decreased.

All the memory blocks can be accessed simultaneously to establish a sufficient difference between the bit line voltage and the reference voltage.

All the transistors used in the second example may be n-channel transistors.

In the second example, an example in which data in the memory blocks 10a0, 10a1, 10a2 and 10a3 are accessed in that order is illustrated. The semiconductor memory device 200 may have a structure in which, when the memory cells are sequentially accessed and the address of the memory cell which is presently being accessed reaches a prescribed address, the next memory block becomes an accessible state. An "accessible state" refers to the state in which the bit line is provided with the voltage B1 and the virtual GND line is provided with the voltage D1.

The "next memory block" may be a memory block adjacent to the memory block including the memory cell which is being accessed. The adjacent memory block may be located to the left, right, above, or below the memory block including the memory cell which is presently being accessed.

The "next memory block" may also be a memory block including a memory cell having an address obtained by adding a prescribed number to the address of the memory cell which is being accessed. Alternatively, the "next memory block" may be a memory block including a memory cell having an address obtained by subtracting a prescribed number from the address of the memory cell which is being accessed. Any general algorithm can be used to determine the "next memory block".

EXAMPLE 3

Figure 9:
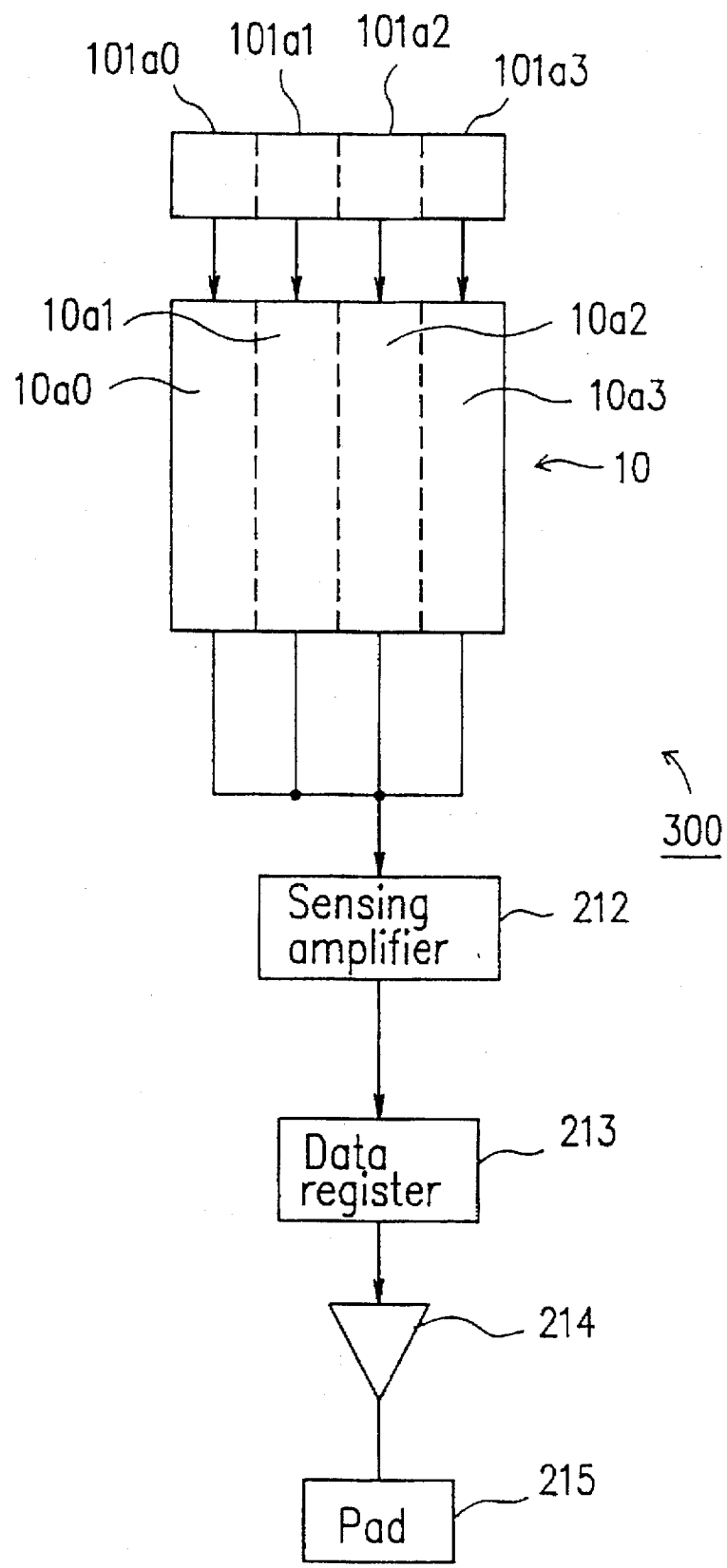
FIG. 9 is a schematic view of a semiconductor memory device in a third example according to the present invention.

With reference to FIG. 9, a semiconductor memory device 300 in a third example according to the present invention will be described. The semiconductor memory device 300 in the third example realizes high-speed access and continuous data reading in a page mode or a burst mode. Identical elements with those in the first and second examples will bear identical reference numerals therewith and the descriptions thereof will be omitted.

As shown in FIG. 9, the semiconductor memory device 300 includes a memory cell array 10 divided into four memory blocks 10a0 through 10a3, peripheral circuits 101a0 through 101a3 for reading data stored in the memory blocks 10a0 through 10a3 respectively, a sensing amplifier 212, a data register 213, a buffer 214 and a pad 215. The peripheral circuits 101a0 through 101a3 are provided on the opposite side of the memory blocks 10a0 through 10a3 from the sensing amplifier 212 and the like in terms of data flow.

Although not shown in FIG. 9, each memory block includes a bit line access circuit for supplying the memory cell with an access voltage level which is lower than the precharge voltage level by a prescribed value, and a bit line precharge circuit for supplying the bit line with a precharge voltage level. Each memory block further includes a virtual GND line access circuit for lowering the level of the virtual GND line corresponding to the memory cell to be accessed from the precharge voltage level to the access voltage level and a virtual GND line precharge circuit for supplying the bit line with a precharge voltage level.

As shown in, for example, FIG. 3, the drain/source electrode of each memory cell is connected to a bit line (represented by B0, etc.), and the source/drain electrode of each memory cell is connected to a virtual GND line (represented by V0, etc.). Memory cells in the same column are connected to the same bit line and the same virtual GND line. Memory cells in the same row are connected to a common word line (represented by WL1, etc.).

Each peripheral circuit includes a determination circuit and a selection circuit. The determination circuit is provided for determining, based on a column address signal, whether the bit line and the virtual GND line connected to the memory cell to be accessed needs to be provided with an access voltage level or a precharge voltage level. The selection circuit is provided for selecting the bit line access circuit or the bit line precharge circuit and for selecting the virtual GND line access circuit or the virtual GND line precharge circuit, based on the determination of the determination circuit.

In the case where the semiconductor memory device includes 16 data output lines, the memory area is divided into 16 regions. The semiconductor memory device 300 shown in FIG. 9 has four data output lines and the memory area is divided into four regions.

The semiconductor memory device 300 operates in the following manner.

When the determination circuit determines that immediate access to the memory block is not necessary, all the bit lines and all the virtual GND lines in the memory block are provided with a precharge voltage level by the bit line precharge circuit and the virtual GND line precharge circuit. Thus, precharge is completed.

When the determination circuit determines that immediate access to the memory block is necessary, the desired bit lines in the memory block which are connected to the memory cells to be accessed can be provided with an access voltage level.

The desired virtual GND lines connected to the memory cells to be accessed are provided with a GND level voltage by the virtual GND access circuit. In this manner, the memory cells are accessed; namely, the potential of the desired bit lines moves to the GND potential. It should be noted that the potential of the desired bit lines moves to the GND potential only when the corresponding memory transistors are in an "ON" state.

Table 1 shows the relationship between the potential of the bit lines and virtual GND lines connected to the memory cells to be accessed and the potential of the other bit lines and virtual GND lines.

TABLE 1

| State of memory block | Bit lines | Virtual GND lines |
| --- | --- | --- |
| Not selected | Precharge voltage level | Precharge voltage level |
| Selected | Lower than precharge voltage level by a prescribed value | GND level |

In a conventional semiconductor memory device, desired bit lines connected to the memory cells to be accessed need to be precharged immediately after a column address signal is input. In the semiconductor memory device in the third example, immediately after a column address signal is input, the corresponding virtual GND line is provided with a GND level voltage. Since the potential of the corresponding bit line has already moved to the GND potential, substantially no time is required for the potential of the bit line to be determined when the memory cell is accessed.

Even if the time required for the memory cell to be accessed is equal to that in the conventional semiconductor memory device, the difference between the voltage level of the bit line to be accessed and the reference voltage is larger than that in the conventional semiconductor memory device. The voltage level of the bit line to be accessed becomes equal to the reference voltage in a shorter period of time in the semiconductor memory device in the third example than in the conventional semiconductor memory device.

EXAMPLE 4

Figure 10:
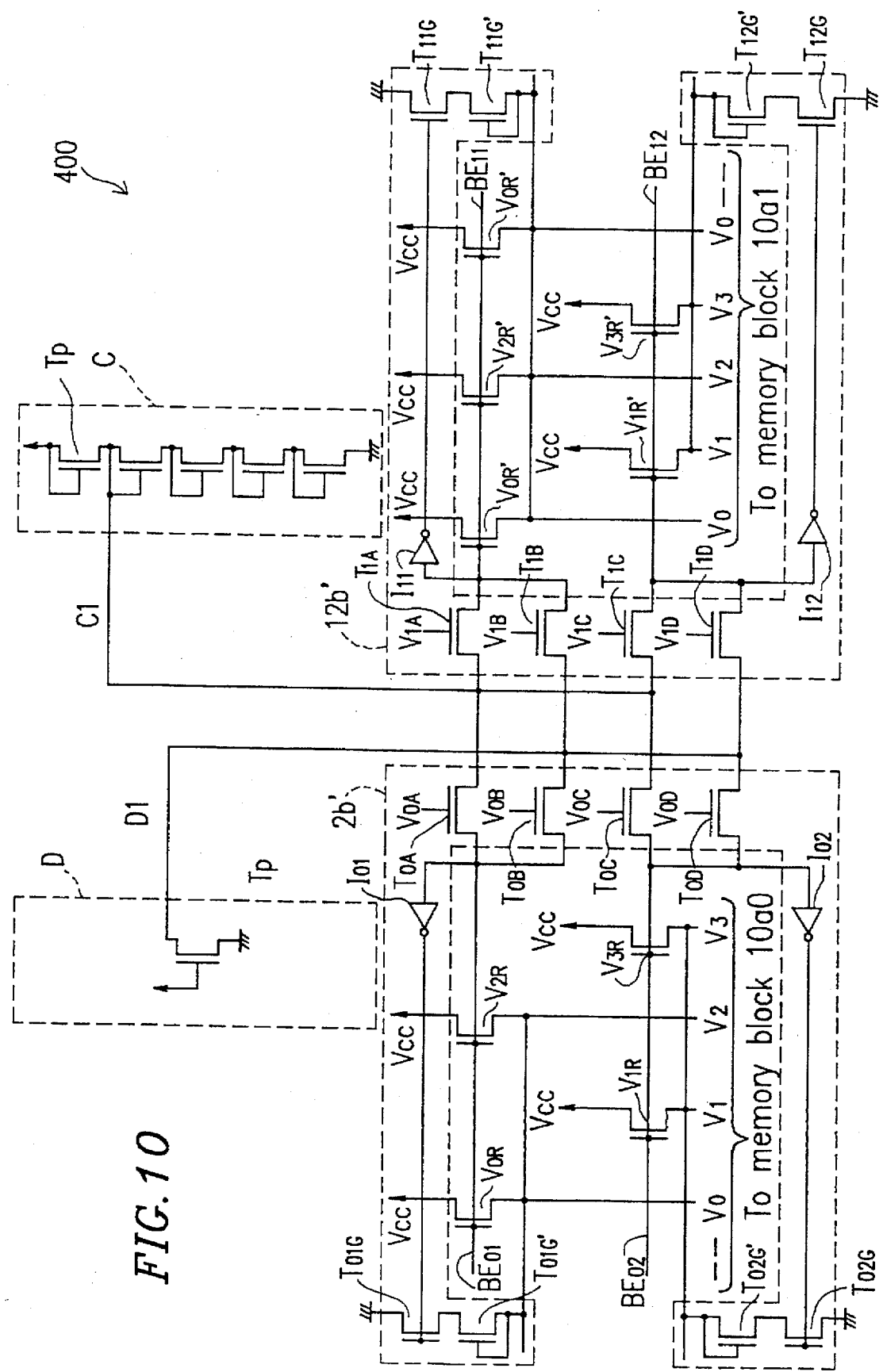
FIG. 10 is a circuit diagram of virtual GND selection circuits and the vicinity thereof in a semiconductor memory device in a fourth example according to the present invention.

With reference to FIG. 10, a semiconductor memory device 400 in a fourth example according to the present invention will be described.

In the semiconductor memory device 400 in the fourth example, the determination circuits 1, 11, 21 and 31 in the semiconductor memory device 200 in the second example are modified to fulfill the conditions (1) and (2) described below. Determination circuits in the semiconductor memory device 400 respectively control the bit line precharge/access circuits 3, 13, 23 and 33 (same as the circuits shown in FIG. 2) and the virtual GND line precharge/access circuits 5, 15, 25 and 35 (same as the circuits shown in FIG. 2) so as to fulfill the conditions (1) and (2).

(1) When a desired word line rises in potential to activate corresponding memory cells in a page, the potential of the bit lines selected by a control line among all the bit lines connected to the memory cells is lowered from the precharge voltage level to an access voltage level which is lower than the precharge voltage level by a prescribed value.

(2) When a desired word line rises to activate corresponding memory cells in a page, the potential of the virtual GND lines selected by a control line among all the virtual GND lines connected to the memory cells is lowered from the precharge voltage level to a level which is higher than the GND level by a prescribed value. Such a level is used as an access voltage level.

In the fourth example, all the memory cells in a page to be read are in an accessible state. In order to compensate for an increase in power consumption by the bit lines and the like due to such a system, the access voltage level of the virtual GND lines are set to a value slightly higher than the GND level. By such a setting, when the data in the memory cell is accessed, the change in the potential of the bit line can be restricted to a sufficiently small value. As a result, the power consumption of the semiconductor memory device can be reduced. This is very effective in a ROM because a ROM consumes a much greater amount of power when precharging than a DRAM or the like.

In the state where all the memory cells in the page to be read are in an accessible state, the potentials of the bit lines and the virtual GND lines connected to the memory cells have already been determined. By such a system, the difference between the potential of the bit line and the reference potential can be larger than in the conventional semiconductor memory device.

Such a larger potential difference is advantageous because amplification of data by the sensing amplifier is performed in a shorter time period by comparing the potential of the bit line and the reference potential when the potential difference is sufficiently large.

With reference to FIG. 10, virtual GND selection circuits 2b' and 12b' and the vicinity thereof in the semiconductor memory device 400 will be described.

In the virtual GND selection circuit 2b', a diode-connected load transistor T01G' is connected to a GND-side load transistor T01G. The load transistor T01G' is connected to virtual GND lines V0 and V2. A diode-connected load transistor T02G' is connected to a GND-side load transistor T02G. The load transistor T02G' is connected to virtual GND lines V1 and V3.

In the virtual GND selection circuit 12b', a diode-connected load transistor T11G' is connected to a GND-side transistor T11G. The load transistor T11G' is connected to virtual GND lines V0 and V2. A diode-connected load transistor T12G' is connected to a GND-side transistor T12G. The load transistor T12G' is connected to virtual GND lines V1 and In the fourth example, the voltage applied to the virtual GND lines for accessing the memory cells is higher than that in the second example. Accordingly, when the word line becomes active and the memory cell connected to the word line is turned "ON", the potential of the corresponding bit line decreases by a smaller value than in the second example. Thus, the potential of the bit line can be established in a shorter period of time, and the memory cells can be accessed with a smaller power consumption.

As described above, in the page mode, the bit lines and the virtual GND lines connected to all the memory cells in a page to be read have an access voltage level. Accordingly, high-speed random access to all such memory cells can be performed, and data stored in the memory cells connected to the common word line and different bit lines are sequentially read.

Figure 11A:
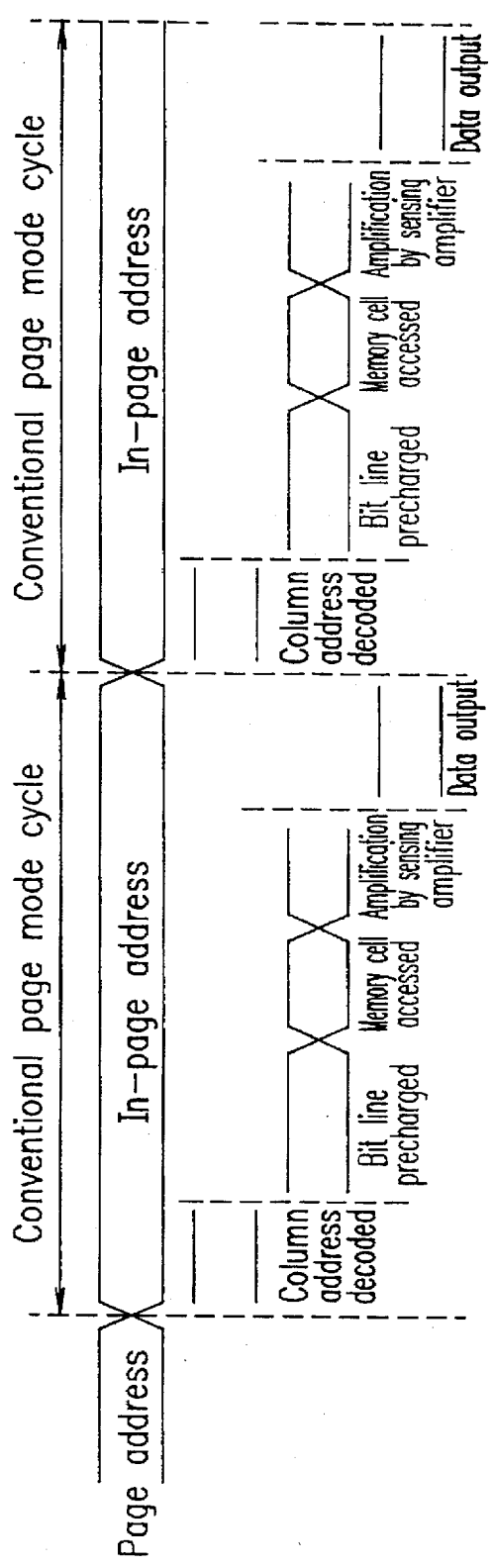
FIG. 11A is a timing diagram illustrating the random access operation of a conventional semiconductor memory device.
Figure 11B:
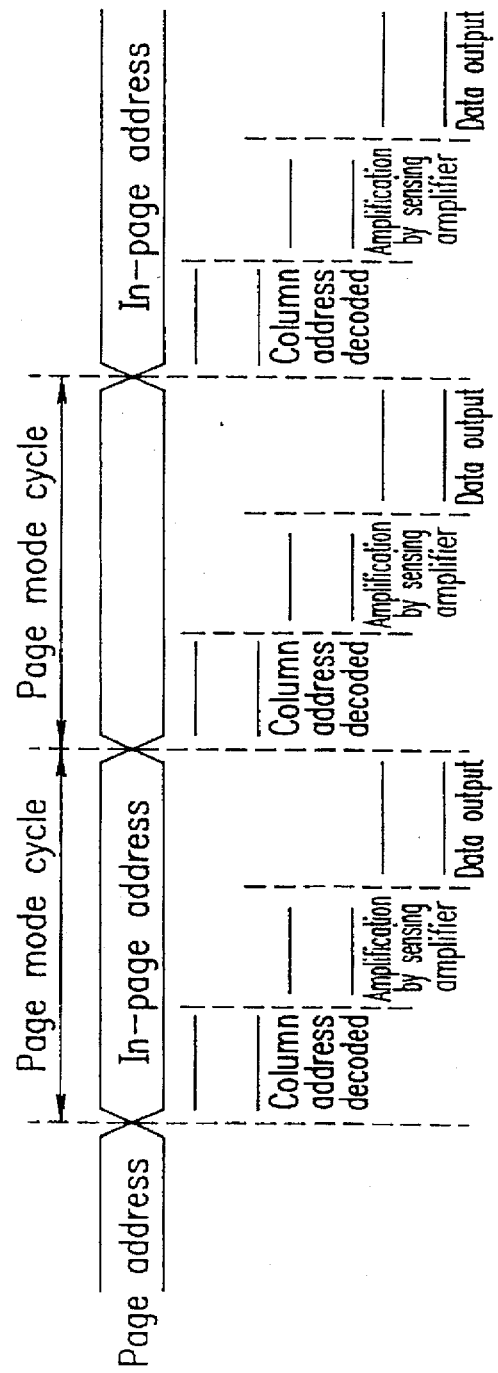
FIG. 11B is a timing diagram illustrating the random access operation of the semiconductor memory device shown in FIG. 10.
Figure 12:
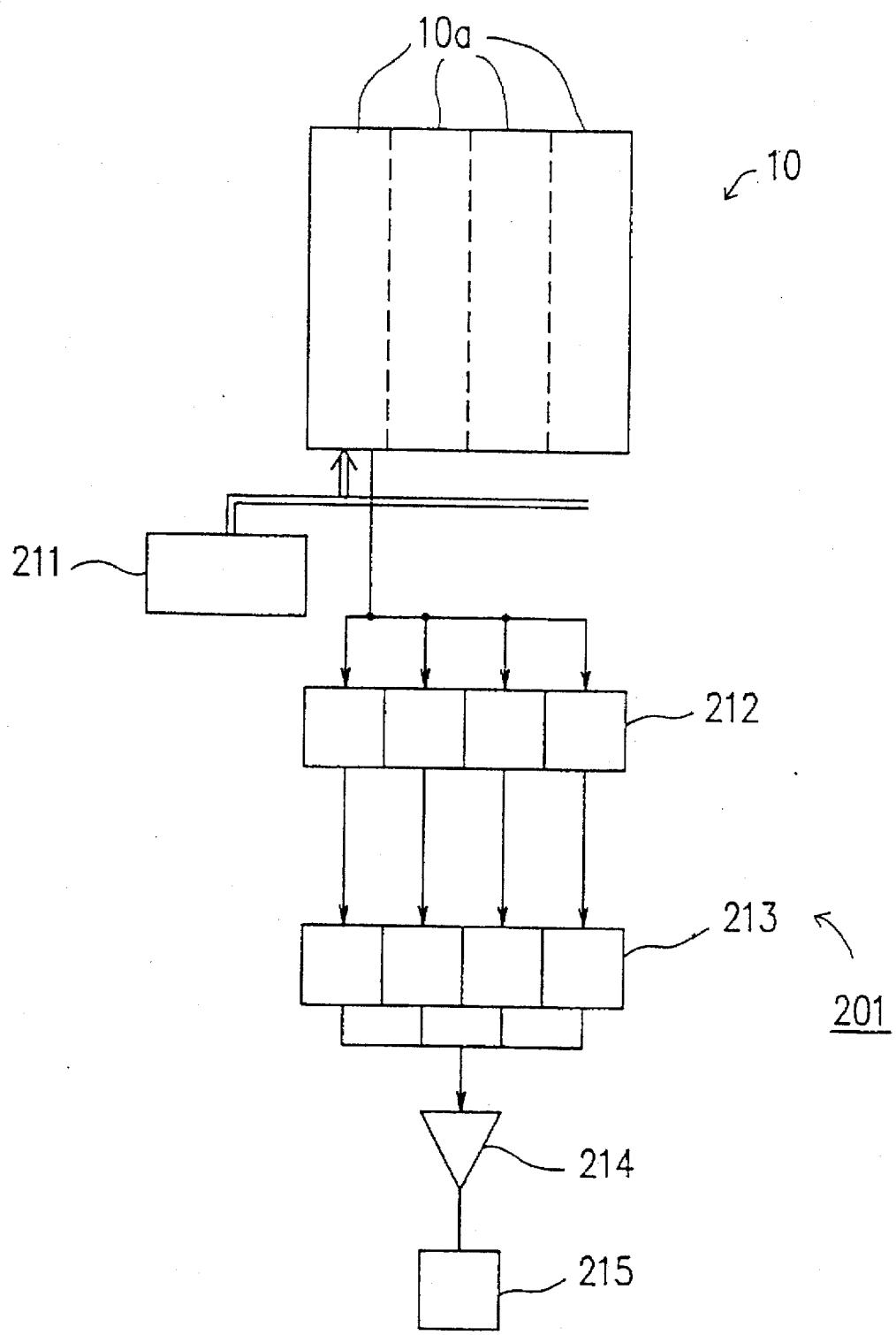
FIG. 12 is a schematic view of a conventional semiconductor memory device.
Figure 13:
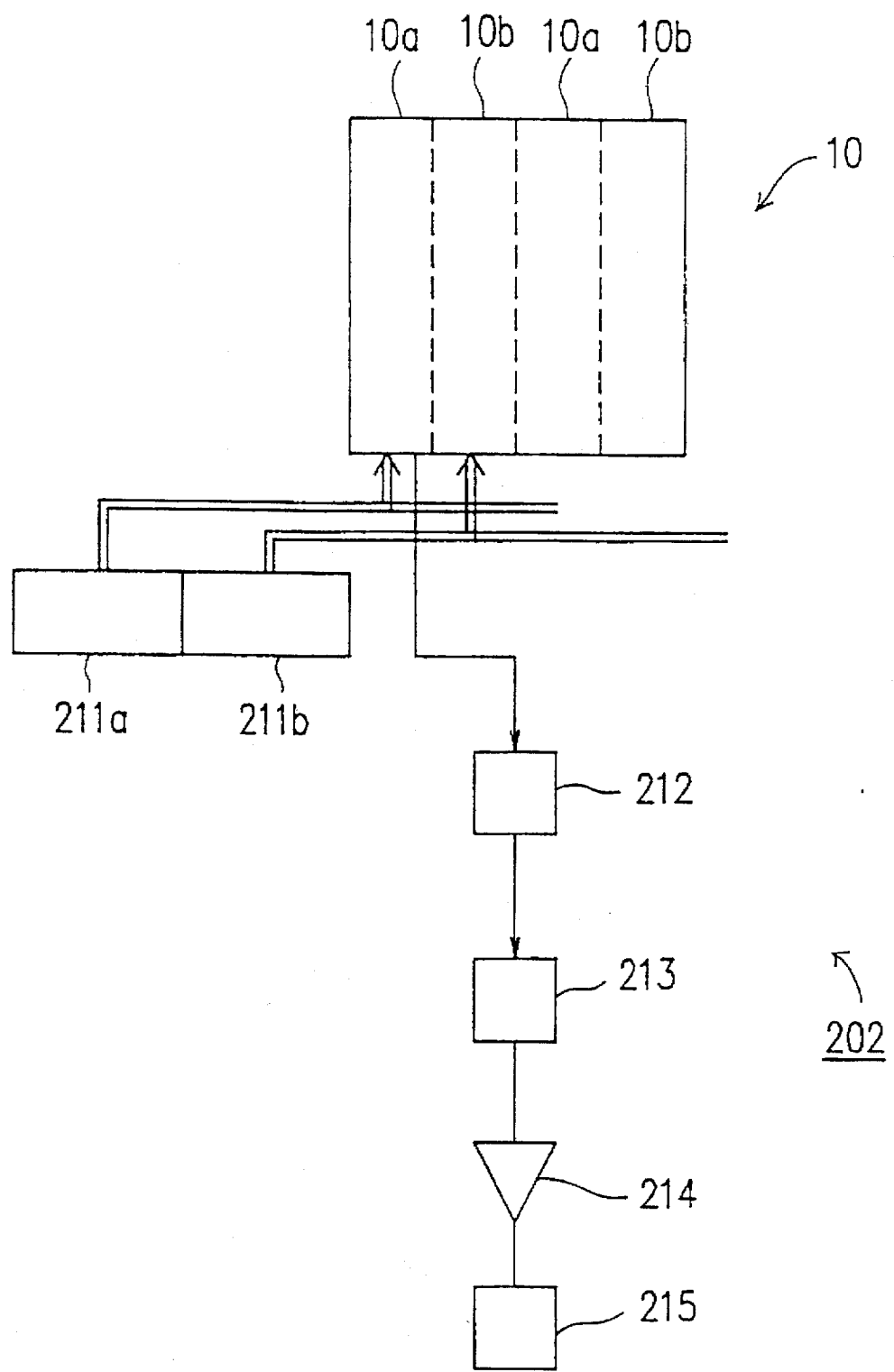
FIG. 13 is a schematic view of another conventional semiconductor memory device.

With reference to FIGS. 11A and 11B, random reading of data in a page performed by a conventional semiconductor memory device and the semiconductor memory device 400 will be compared.

FIG. 11A is a timing diagram illustrating the operation of the conventional semiconductor memory device in the page mode, specifically, random reading of data in a page. Since it is difficult to predict the data to be read in the page, the bit lines are precharged after the column address signal is input to the decoder. When the memory cell is in an "ON" state, the potential of the bit lines moves to the virtual GND potential. Then, the data stored in the memory cell is amplified by the sensing amplifier.

FIG. 11B is a timing diagram illustrating random reading of data in the semiconductor memory device 400 in the page mode. While the column address signal in the page is decoded, the bit lines are precharged and the memory cell is accessed. After the column address signal is decoded, the data stored in the memory cell is amplified by the sensing amplifier. In this manner, higher speed reading is realized.

The present invention is applicable to any type of semiconductor memory device such as a ROM or a flash memory.

The transistors included in the semiconductor memory device according to the present invention may all be n-channel transistors.

According to the present invention, the memory cells including data to be read are precharged and accessed before the bit lines are amplified by the sensing amplifier. By such a system, amplification and storage of the data by the sensing amplifier and the data register can be performed sequentially for the memory cells to be accessed. Thus, data reading can be accomplished continuously and at a higher speed. For reading data in memory cells belonging to a page, the same advantages can be obtained.

Due to such a system, a conventional circuit configuration without a precharge circuit can be used in the semiconductor memory device according to the present invention. Accordingly, the size and number of the peripheral circuits are reduced, thereby decreasing the area of the chip.

Thus, according to the present invention, continuous and high-speed data reading is realized without increasing the chip area.

When the bit lines are provided with a precharge voltage level, the bit lines are in a prechargeable state, and when the virtual GND lines are provided with a precharge voltage level, the virtual GND lines are in the prechargeable state. Further, when the bit lines are provided with an access voltage level, the bit lines are in an accessible state, and when the virtual GND lines are provided with an access voltage level, the virtual GND lines are in the accessible state.

In the first, second and third examples, the access voltage level for the bit lines is lower than ½ Vcc by a prescribed value, and the access voltage level for the virtual GND lines is a GND level. In the fourth example, the access voltage level for the bit lines is lower than ½ Vcc by a prescribed value, and the access voltage level for the virtual GND lines is higher than the GND level by a prescribed value. In the first, second and third examples, the access voltage level for the virtual GND lines may higher than the GND level by a prescribed value.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:
   a plurality of memory cells arranged in a matrix, each of which has a gate electrode, a first electrode and a second electrode;
   a plurality of word lines, at least one of which is connected to the gate electrode of one of the plurality of memory cells;
   a plurality of bit lines, at least one of which is connected to the first electrode of one of the plurality of memory cells;
   a plurality of virtual ground lines, at least one of which is connected to the second electrode of one of the plurality of memory cells;

a determination circuit for generating a determination signal based on an address signal; and a precharge and access circuit for applying one of a first voltage and a second voltage to at least one of the plurality of bit lines and applying one of a third voltage and a fourth voltage to at least one of the plurality of virtual ground lines, based on the determination signal.

2. A semiconductor memory device according to claim 1, the plurality of memory cells are divided into a plurality of memory blocks.

3. A semiconductor memory device according to claim 2, wherein the determination circuit determines, based on the address signal, whether to provide a bit line in one of the plurality of memory blocks with the first voltage or the second voltage and whether to provide a virtual ground line in the one of the plurality of memory blocks with the third voltage or the fourth voltage.

4. A semiconductor memory device according to claim 2, wherein the precharge and access circuit provides a bit line in the memory block including a memory cell to be accessed with the second voltage which is lower than the first voltage by a prescribed value, and provides a virtual ground line in the memory block including the memory cell to be accessed with a voltage of a ground level.

5. A semiconductor memory device according to claim 2, wherein the precharge and access circuit provides a bit line in the memory block including a memory cell to be accessed with the second voltage which is lower than the first voltage by a prescribed value, and provides a virtual ground line in the memory block including the memory cell to be accessed with a voltage of a level higher than a ground level by a prescribed value.

6. A semiconductor memory device according to claim 1, wherein the first voltage is equal to the third voltage, the second voltage is lower than the first voltage by a prescribed value, and the fourth voltage has a ground level.

7. A semiconductor memory device according to claim 1, wherein the first electrode is a drain electrode and the second electrode is a source electrode.

8. A semiconductor memory device according to claim 1, wherein the first electrode is a source electrode and the second electrode is a drain electrode.

9. A method for accessing data in a memory cell in a semiconductor memory device having a plurality of memory cells divided into a plurality of memory blocks, the method comprising the steps of:

putting a bit line and a virtual ground line connected to each of a plurality of first memory cells in one of the first memory blocks into a prechargeable state;

putting a bit line and a virtual ground line connected to a second memory cell in a second memory block which needs to be accessed into an accessible state, and putting a bit line and a virtual ground line connected to at least one of the first memory cells in one of the first memory blocks which succeeds the second memory block into the accessible state while the second memory cell is being accessed.

10. A method for accessing data in a memory cell in a semiconductor memory device having a plurality of memory cells divided into a plurality of memory blocks, the method comprising the steps of:

putting a bit line and a virtual ground line connected to a memory cell storing data included in a page to be accessed into an accessible state; and putting a bit line and a virtual ground line connected to a memory cell storing data included in other pages into a prechargeable state.

11. A method according to claim 10, wherein the page includes data stored in an area from a first address to a second address.

* * * * *